United States Patent [19]
Pearson

[11] 4,238,731
[45] Dec. 9, 1980

[54] INSTRUMENT MOVING ELEMENT WITH SEVERABLE BRIDGE

[75] Inventor: David B. Pearson, Raritan, N.J.

[73] Assignee: Sangamo Weston, Inc., Norcross, Ga.

[21] Appl. No.: 883,671

[22] Filed: Mar. 6, 1978

Related U.S. Application Data

[62] Division of Ser. No. 738,305, Nov. 3, 1976, Pat. No. 4,080,570, which is a division of Ser. No. 532,245, Dec. 12, 1974, Pat. No. 3,997,840, which is a division of Ser. No. 391,496, Aug. 24, 1973, Pat. No. 3,882,389, which is a division of Ser. No. 173,425, Aug. 20, 1971, Pat. No. 3,764,909.

[51] Int. Cl.³ .......................... G01R 1/04; G01R 5/06; G01R 3/00
[52] U.S. Cl. .................................. 324/154 R; 29/595; 324/151 A
[58] Field of Search ............... 324/150, 151 R, 151 A, 324/154 R, 155, 154 PB; 29/606, 607, 595

[56] References Cited

U.S. PATENT DOCUMENTS

| | | | |
|---|---|---|---|
| 579,344 | 3/1897 | Houston et al. | 324/151 R |
| 799,733 | 9/1905 | Hartmann | 324/154 R |
| 2,542,692 | 2/1951 | McCarty et al. | 324/154 R |
| 2,871,450 | 1/1959 | Podoloff | 324/154 R |
| 3,406,340 | 10/1968 | Seibel | 324/154 R |
| 3,684,959 | 8/1972 | Spira et al. | 324/151 R |
| 3,737,772 | 6/1973 | Kunz et al. | 324/154 |

Primary Examiner—Gerald R. Strecker
Attorney, Agent, or Firm—Kevin McMahon; Dale Gaudier; Mikio Ishimaru

[57] ABSTRACT

An electric meter particularly characterized by a small number of moving parts and simplified assembly by virtue of fixed cooperating locating surfaces on the elements and sub-assemblies of the meter. A magnetic circuit including a yoke and magnet are constructed to snap into an insulating base in a predetermined position on the base. A coil assembly initially including integral elements for connection of pivot bearings or taut bands is accurately positioned for rotation on the supporting base by inserting the assembly into the base. Cooperating locating surfaces provide for accurate predetermined positioning of the axis of rotation of the coil relative to the magnetic circuit. Additional features of the meter construction reside in a direct gear drive between a zero adjust element and zero adjust knob mounted in a cover for the meter, a unique base, casing, and cover which snap together, a coil support form of unique construction and which includes motion limiting elements which limit the permissible extent of movement of the coil in the event of shock or impact to positions well within the elastic limit of the supports which mount the coil for rotation, a unique mode of terminating the end connections for the coil without the need for stripping insulation, a unique mounting arrangement for the assembled meter, a unique rear mounting scale plate which provides for easily replacing scale plates to meet the needs of the user of the meter, a meter movement of a single size adapted to be used with casings and scales of various sizes whereby the number of different parts required to form meters of different sizes is maintained at a minimum, a unique insulating material base with flexibility to permit expanding the base during assembly of the meter, and sub-assemblies, components, and elements which can be assembled in only one position and orientation to assure proper assembly of the meter.

13 Claims, 19 Drawing Figures

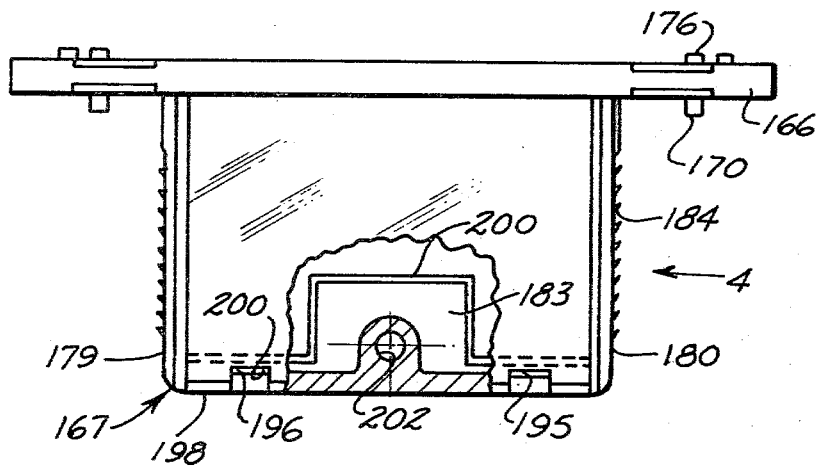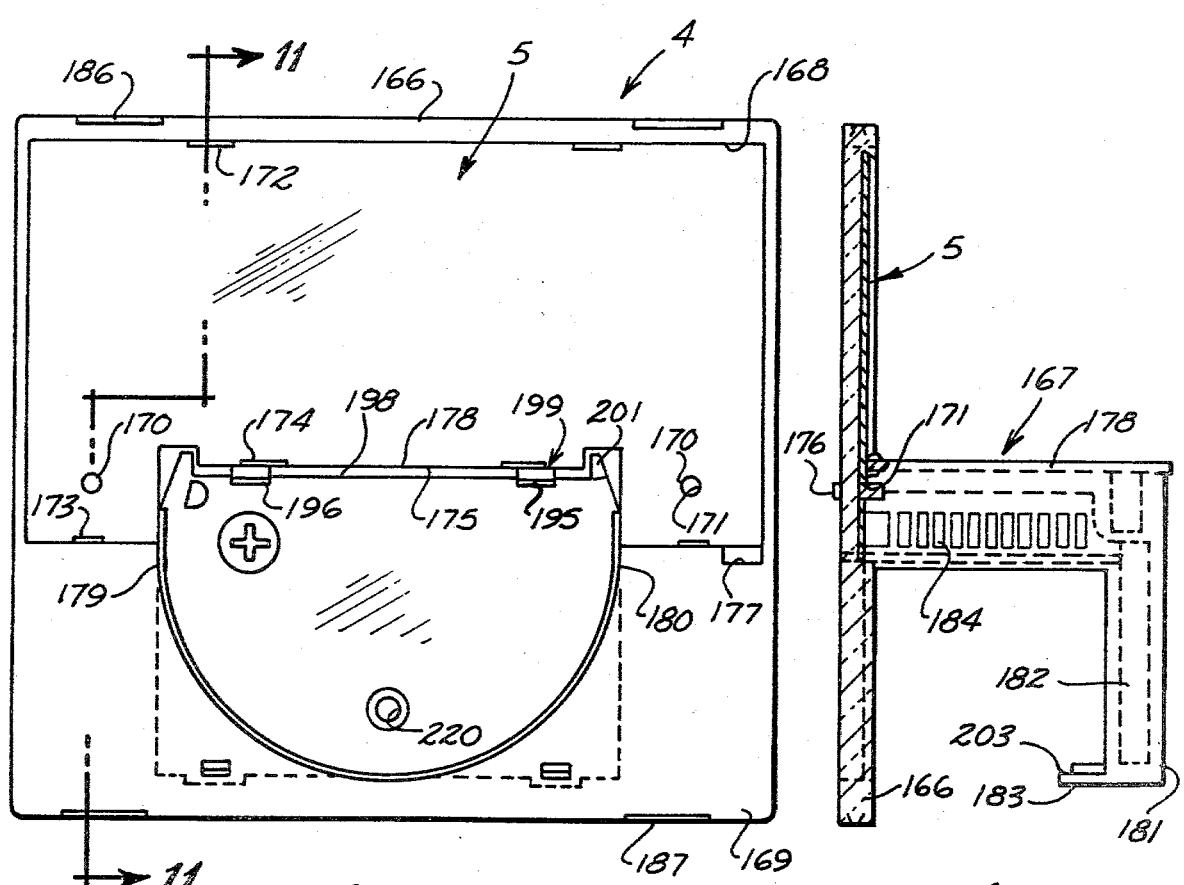

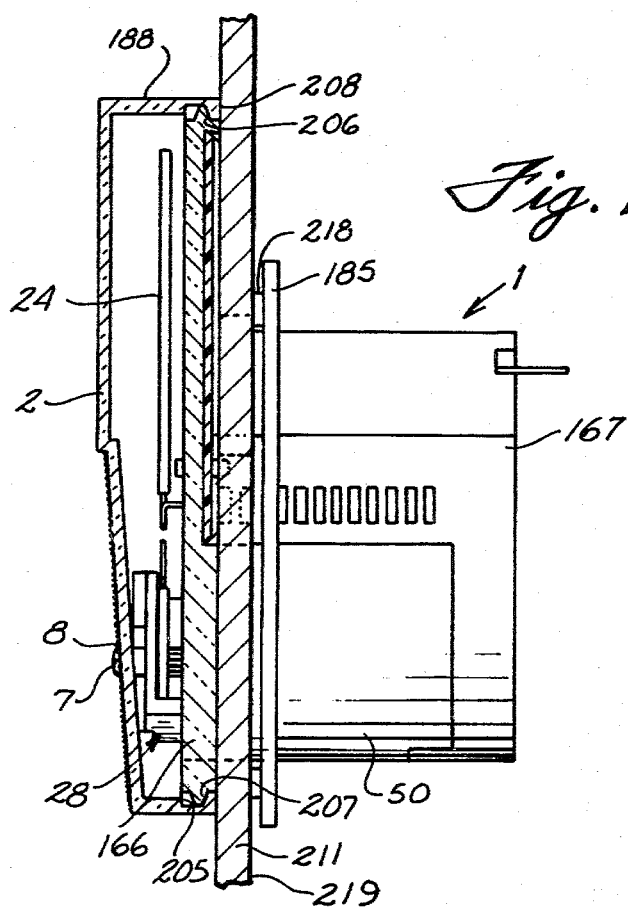
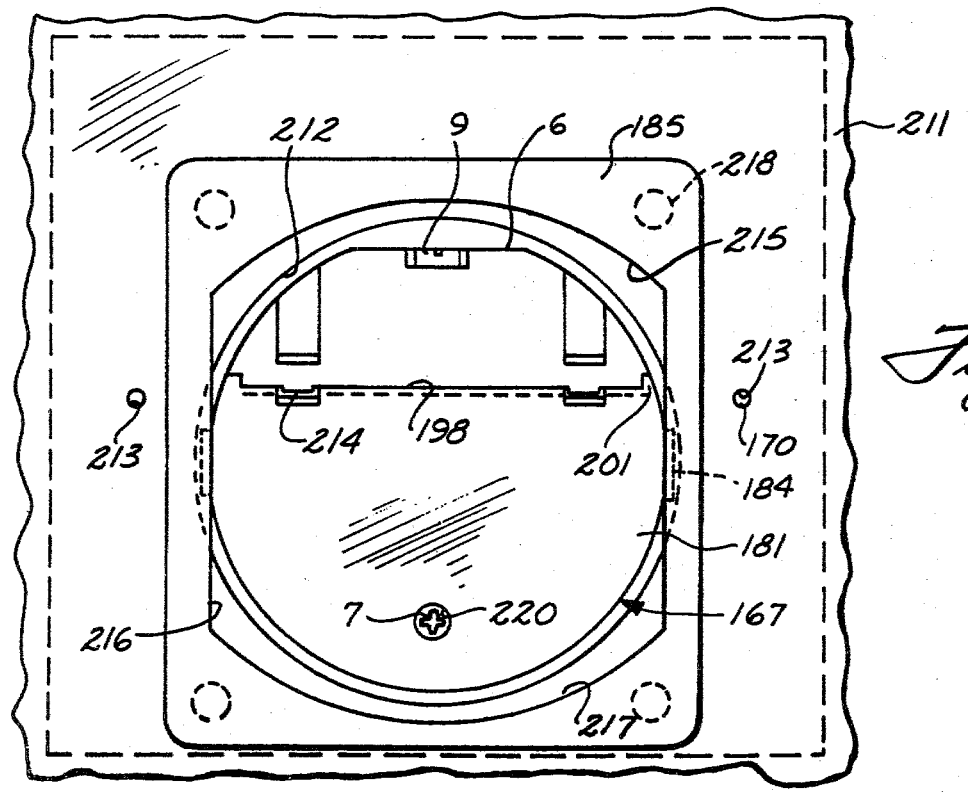

INSTRUMENT MOVING ELEMENT WITH SEVERABLE BRIDGE

This is a division of Ser. No. 738,305, filed Nov. 3, 1976, now U.S. Pat. No. 4,080,570, which was a division of Ser. No. 532,245, filed Dec. 12, 1974, now U.S. Pat. No. 3,997,840, which was a division of Ser. No. 391,496, filed Aug. 24, 1973, now U.S. Pat. No. 3,882,389, which was a division of Ser. No. 173,425, filed Aug. 20, 1971, now U.S. Pat. No. 3,764,909.

This invention relates to an electric meter of the moving coil type which is particularly adapted for manufacture by mass production methods. The invention also relates to a unique moving coil construction, as an intermediate product of manufacture, wherein the coil frame has integrally attached support elements which are subsequently severed from the coil frame and provide supports for mounting the coil for pivotal movement to a supporting base. In addition, the invention permits a method of manufacturing both the moving coil and the meter including the coil, on a mass production basis using a minimum number of parts and assembly steps to provide an accurate instrument.

Because of the number of steps required to assemble and the number of parts required for constructing measuring instruments of the moving coil type such as D'Arsonval meters, such meters have not in the past been as capable of mass production manufacture as the meter of the present invention. Because of the large number of parts, and the numerous adjustments required, prior meters are relatively expensive. In these prior art meters, forming the various parts for the meter and assembling same to form the meter is quite time consuming. Typical steps required are forming the moving coil portion of the instrument, connecting suitable supports to the frame of the moving coil to support jewels or a taut band (depending on the suspension for the instrument) forming a casing, mounting the magnetic circuit for the meter in the casing, installing the moving coil, connecting taut bands or bearings to the moving coil to suspend the coil, aligning the suspension for the coil so the coil rotates about a predetermined axis, adjusting the magnetic circuit to provide a desired range of coil deflection characteristics, mounting a meter scale with appropriate indicia corresponding to the deflection characteristics of the meter, balancing the coil to compensate for the weight of the pointer, and zero adjusting the meter. In the past, the suspension of the coil on its base support has been accomplished manually and this step is quite time consuming since the coil must be carefully aligned with fixed connectors on the base support and various parts and pieces of the suspension are then connected to suspend or otherwise mount the coil for rotation. Then, because it is difficult to always mount a coil for rotation about the same axis in each and every assembly, it is necessary to adjust or reposition the magnetic circuit to compensate for slight differences in the location of the axis of rotation of the coil for successively assembled instruments of the same type. Finally, even after pointers and counter balance weights are connected to the moving coil, it is necessary to test the instrument to determine what the scale deflection characteristics of the meter are and then select from one of several scales a scale that accurately represents the deflection characteristics of the instrument. Correspondingly, the prior art meters simply have too many parts to permit economical assembly even by mass production methods. As a result it was quite expensive to provide a meter with an accuracy of for example, 2% of full scale deflection.

The meter and moving coil of this invention overcome many of the disadvantages of the prior art moving coil instruments. By virtue of its unique construction this meter uses only a small fraction of the number of parts required in previous meters. Since the number of parts is reduced, the number of assembly steps is correspondingly reduced with the result that the meter is well adapted to be manufactured on a mass production assembly line basis to provide an accurate meter with good tracking characteristics.

A substantial reduction of the number of parts required is obtained by virtue of a unique moving coil assembly manufactured in accordance with this invention. This coil assembly, in the preferred embodiment, includes two identical coil support forms of electrically conductive material which are of precision manufacture. Formed integral with these support forms are terminals for the coil wire to be wound on the forms. Also, integral with the forms are the connecting and support elements which support the coil both at the coil form and in the supporting base of the assembled meter and to which the taut band or jewels are connected, a staff for subsequent connection of a pointer, and a serrated slot for connection of a counterbalance weight. In the taut band type of suspension the support element is also a zero adjust element. The support elements have locating surfaces for accurately positioning them on the base. Advantageously, the coil support forms are held together in insulated relation to each other by the wire which is wound on the supports to form the coil. Correspondingly, it is merely necessary to connect one end of the coil wire to one of the support forms and the other end of the coil wire to the other of the support forms whereupon, the necessary electrical connections to the coil can be subsequently made quite readily directly to the respective support forms.

Additional advantageous features of the meter construction of this invention are a base or support structure for the various elements of the meter, this base also being of precision manufacture and preferably of an insulating plastic material. Among the characteristics of this base are predetermined fixed locating surfaces for the elements forming the magnetic circuit of the meter, and locating surfaces for the support elements for the moving coil to assure that coils of successively manufactured meters all rotate about essentially the same axis relative to the base and terminal locators which provide for rapidly connecting the coil to external terminals.

In the preferred embodiment, the magnetic circuit has a diametrically split yoke which includes two identical semi-circular half shells of a magnetic material such as soft iron arranged to receive therebetween a permanent magnet in a predetermined position relative to the axis of rotation of the coil. The half shells of magnetic material are precisely positioned in the base by virtue of cooperating locating surfaces on the base and shells, and the permanent magnet is precisely positioned within the yoke by virtue of cooperating locating surfaces on the shells, permanent magnet, and the base. Since the axis of rotation of the coil is predetermined by virtue of the cooperating locating surfaces on the insulating material plastic base and the support elements for the coil, and since the various parts of the magnetic circuit are each precisely located on the base and relative to each other, it is assured that the axis of rotation of the coil is at the same position with respect to the magnetic circuit in successively assembled meters.

The several locating surfaces on the supporting base are integrally formed with the base and the construction of the base, magnetic circuit parts, and coil assembly is such that the meter movement is easily assembled by "snapping" the parts together without additional fasteners.

An additional advantage of the construction of this invention is that one meter movement can be used to provide a meter with numerous different scale sizes. For example, the same meter movement can be used for a 2" scale meter that is used for a 6" or 7" scale meter. This is accomplished by use of a very light weight dimensionally stable and non-moisture absorbing plastic pointer of the required length which is mounted on the coil form after assembly of the meter movement. To assure proper balancing, a counterweight for the selected pointer is positioned on and crimped on the moving coil. Additional advantageous features of the meter of this invention reside in the construction of and the mode of connection of the case to the meter movement, the mode of connection of the scale to the case, the construction and mode of connection of the pointer cover to the case, and the construction of and mode of connection of a desired terminal arrangement to the assembled meter.

An additional feature resides in an optically clear scale support plate which permits mounting the scale face on either the front or rear of the scale support plate. By virtue of this arrangement where the scale is mounted on the rear surface of the support plate, the scale is exposed and it is a simple matter to remove a scale from the meter and replace it with a scale having different appropriate indicia. Correspondingly, the user of the meter can readily tailor the meter to his needs by applying an appropriate scale to the meter in a simple snap action fashion.

An additional significant feature of the invention resides in the construction of the support elements for the coil assembly, at least one of the support elements having gear teeth formed thereon for direct engagement by a gear toothed zero adjust knob supported by the meter casing. Since the zero adjust spring, be it a spiral spring in the case of a pivot bearing support for the coil, or torsion spring in the case of a taut band suspension type support for the coil, is directly connected to the gear toothed zero adjust element, the number of parts required is reduced and the arrangement is simplified.

In addition, the coil frame is comprised of two similar halves which may be identical to reduce tooling costs. Each frame half has combined support and zero adjust elements as an integral part thereof. Immediately prior to assembly of the meter the support elements are severed from the coil assembly and the support elements are then merely inserted in the insulating material base to simultaneously position the support elements and mount the coil assembly for rotation.

The coil frame is further provided with stop surfaces which limit the extent of axial as well as transverse movement of the coil assembly to prevent damage to the suspension elements for the coil even though the meter is dropped or otherwise impacted. The stops are so arranged that the coil assembly cannot move to any position in which the elastic deformation of the elements which support the coil for rotation is exceeded.

An additional feature of the invention resides in a unique damping ring arrangement which can be used where it is desired to limit the rate of deflection of the coil assembly. By virtue of its construction and the manner in which the damping ring is connected to the coil assembly, the damping ring can be optionally provided at very little additional expense.

The insulated base of plastic material is so constructed that the base has flexibility which permits spreading apart plastic material bridge elements that support the coil assembly so the coil assembly and support elements can be readily positioned in the base. In addition, the base includes integral mounts for rigid conductors to carry the current to the meter coil. This arrangement avoids the need for threading fine wires to the terminals of the meter during assembly. An additional advantage of the positioning mounts and the rigid conductors is that these conductors are precisely located on the base relative to openings in the casing for the meter, and correspondingly, provide for mounting the movement in its casing merely by sliding the elements together until snap fingers secure the meter movement to the casing. There is no need for any special alignment during this operation, since the base and casing have cooperating slide surfaces which guide the parts together.

With regard to construction economy, parts of the meter which are used in pairs, for example, the coil support forms and the split rings which form the yoke of the magnetic circuit, can be of identical construction so the total number of different precision parts is maintained at an absolute minimum. Moreover, these parts are so constructed relative to the parts with which they interengage and are connected that they can only be installed in one position, during the assembly of the meter. The parts will not fit unless they are properly oriented.

An additional significant advantage of the construction of the meter is that almost all of the same basic parts are used in the construction of a meter for jewelled (bearing) movement or taut band suspension. For example, using the same magnetic circuit, base support and coil support blanks, a meter of either the taut band suspension type or jewelled suspension type can be constructed merely by assembling the proper suspension elements at appropriate times during the manufacturing and assembly operations. However, most of the manufacturing steps for the meter for each type of suspension are the same and are accomplished in the same manner for both types of instruments.

As previously mentioned, a significant feature of the meter is the moving coil assembly wherein many of the separate elements of prior art meters are initially formed as an integral portion of the coil support. This integral structure is carefully formed so the position of the axis of rotation of the coil is predetermined relative to the integrally connected supports. Then, with the supports and the coil in proper alignment, connections are severed which free the supports. However, prior to such severing the coil and supports are mounted in a fixture which maintains these elements in predetermined aligned relation to each other and the fixture assures that the coil and support elements are properly installed in the supporting base with the axis of rotation of the coil precisely the same relative to the base in each meter. As a result of this initial integral assembly many of the previous manufacturing steps are eliminated and the meter itself is adapted for manufacture and assembly by mass production methods.

By virtue of the upwardly opening supporting base of an insulated plastic material such as a polysulfone, by virtue of the construction of the base which makes the base inherently elastic to a certain extent and by virtue of the split yoke construction for the magnetic circuit of the meter, assembly is vastly simplified by providing for unidirectional insertion of the first yoke half, then the coil, then the permanent magnet, and then the second yoke half, to assemble the meter with the parts thereof in predetermined precise alignment and at an extremely rapid rate.

Additional advantages and features of the meter of this construction reside in the base of the same meter movement and a case with certain parts of the same size regardless of the size of the scale of the meter, whereby the costs of tooling for the user of the meter are substantially reduced, which further includes integrally formed stops to limit the extent of rotation of the zero adjuster knob whereby the possibility of damage as a result of overrotation of the zero adjust is completely eliminated, wherein the cost of scales is quite nominal so several different scales and can be provided for the same meter and wherein the scale is simply snapped onto the rear of the casing so it is readily removable and interchangeable, wherein sufficient space is provided in the casing for resistors or protective devices to suit the meter to the needs of the user, wherein the resistors used to vary the sensitivity of the meter need not be precision resistors because the meter is calibrated magnetically after the meter is assembled, wherein the scale may be semi-transparent to simplify back lighting, and wherein the meter case can be readily adapted for mounting in virtually any manner, the scale and cover can have any desired configuration, and in which panel mounting of the meter is vastly simplified by use of a flexible Tinnerman-type nut cooperating with preformed ratchet teeth on the body of the meter casing.

Correspondingly, an object of this invention is a low cost moving coil meter or other instrument in which the meter movement can be readily assembled to provide a reasonably accurate instrument at low cost.

Another object is a meter including a base with locating surfaces to provide for accurate positioning of the magnetic circuit for the meter as well as for mounting the supports for a moving coil in precise predetermined relation to the magnetic circuit and base.

Another object is a meter in which a supporting base is provided with both fixed locating surfaces and retaining elements, the magnetic circuit of the meter is installed in the base by the simple expedient of positioning same against the locating surfaces and then pressing the parts thereof into interlocked position with the base, and in which support elements for the coil include locating and retaining portions which interengage with cooperating portions of the base to both position and retain the support elements on the base.

Another object is a moving coil assembly, as an intermediate product of manufacture, in which the coil assembly takes the form of a structure with integrally attached support elements which are subsequently severed from the coil from whereby the number of parts for the coil and its suspension are maintained at a minimum.

Another object is a moving coil instrument in which the coil support form and resulting intermediate product of manufacture, namely a coil with integrally attached suspension and zero adjusting elements, is uniquely adapted for use in an electric meter to be assembled by mass production methods.

Another object is a coil for a moving instrument in which the coil form is provided with integral portions to receive either bearing elements for mounting of the coil for rotation, or taut band support elements for suspending the coil for rotation, depending on the desired type of suspension for the meter to be constructed.

Another object is a unique moving coil for an instrument in which the coil form has integrally attached support elements for subsequent connection of bearings or a taut band, the coil is placed on the form and adhered thereto to fix portions of the form in spaced apart electrically insulated relation to other portions of the frame, and coil terminals are provided on the form for connection of the coil ends thereby providing separate electrically conducting paths for the ends of the coil.

A further object is a unique method of assembling the meter of this invention in which the several parts of the magnetic circuit and coil are assembled to a base in a predetermined sequence and in which the coil and its support elements are mounted on the base simultaneously to assure that the rotational axis of the coil is at a predetermined location relative to the base and the magnetic circuit.

Another object is a unique method of forming end connections of a coil or other wire containing device by using a wire with a heat deteriorating insulation such as thermoplastic material, winding the wire about a terminal, and melting the terminal to simultaneously remove the insulation and weld the wire to the terminal, thereby eliminating the need for stripping the wire to form the electrical connection.

Another object is a meter which is assembled primarily by snapping together the various components of the meter including the magnetic circuit, case, scale, cover, and various other components whereby the need for separate fasteners is substantially eliminated.

Another object is a meter of the moving coil type in which the magnetic material yoke thereof is transversely split to facilitate assembly by mass production methods and simplify mounting the coil for rotation about a permanent magnet core.

A further object is a meter including a basic meter movement which can be used with pointers of different lengths and scales of different sizes without altering any of the basic structure of the meter movement.

A further object is an electric meter in which the meter movement has a relatively small size and is installed in a case, also of relatively small size, and in which adaptor elements of various types can be used with the meter for adapting the meter for mounting in virtually any existing installation.

Another object is a meter having a scale which is positioned behind a transparent face plate of a case whereby, the scale can be readily removed and replaced without disassembly of the meter.

A further object is a supporting base for a meter in which the supporting base is formed from a material having some inherent elasticity, a rigid case is provided for the meter, and interengaging slot and groove means on the case and supporting base provide for both mounting the meter movement in the case and compressing the base to assure retention of the parts mounted thereon.

An additional object is a meter of extremely rugged construction wherein the frame for the coil has integrally formed stops and is so dimensioned and arranged that the maximum extent of movement of the coil in any direction as a result of shock or impact is well within the elastic limit of the suspension elements for the coil.

An additional object is a combined zero adjust and support element of integral construction to which the taut band or spiral spring of the coil suspension is directly connected and which has integral gear teeth in mesh with gear teeth of the usual adjust knob, the integral element substantially reducing the number of required parts for the meter.

Another object is a meter construction in which the various parts are so arranged and constructed that during assembly of the meter each part can only be mounted in one possible position, whereby there is no chance for improper assembly.

An additional object is a unique damping ring arrangement for the coil which can be optionally provided at minimal additional cost.

A further object is a meter movement assembly so arranged and constructed that relatively rigid conductors are supported in a predetermined position on the base of the meter to permit final assembly by merely sliding the meter movement into a casing without the need for threading or otherwise connecting fine flexible terminal wires during such assembly.

Still another object is a meter with no cements or other moisture sensitive elements which could subsequently affect the accuracy of the meter.

Numerous other objects, advantages, and features of the invention will become apparent with reference to the accompanying drawings which form a part of this specification and in which:

FIG. 9 is a rear view of the meter case;

FIG. 10 is a top plan view of the meter case of FIG. 9 with portions broken away to show additional details;

FIG. 11 is a view in section taken along line 11—11 of FIG. 9;

FIG. 12 is a side view in section of the assembled meter taken along line 12—12 of FIG. 13 and showing the assembled meter mounted on a panel;

FIG. 13 is a rear view of the meter mounted on a panel and showing the panel mounting nut;

I. THE METER ASSEMBLY

Figure 1:
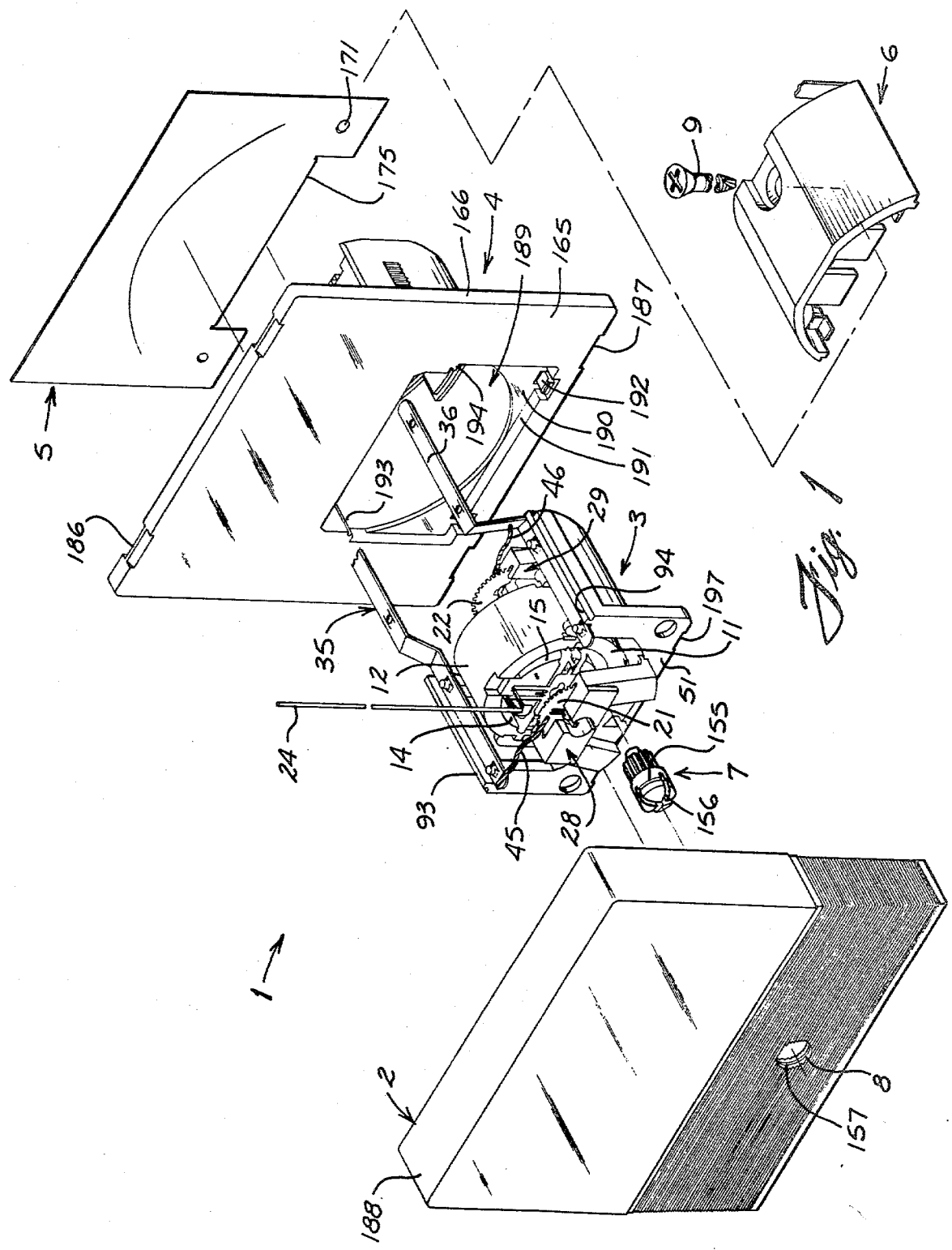
FIG. 1 is an exploded pictorial view of a D'Arsonval meter constructed in accordance with this invention.

Referring now to the drawings and particularly to FIG. 1 there is shown a meter 1 constructed in accordance with this invention. As shown at FIG. 1, the meter includes a cover 2, a meter movement 3, a case 4, a scale 5 and a terminal adapter assembly 6. In addition, there is a zero adjust knob 7 which is mounted for rotation in an opening 8 in cover 2. The various parts of the meter so far described are adapted to be assembled by sliding and/or snapping these parts together with the exception of the terminal adapter 6 which is held in position by the screw 9, and which is only used where a particular meter terminal is needed.

A. THE METER MOVEMENT

Figure 2:
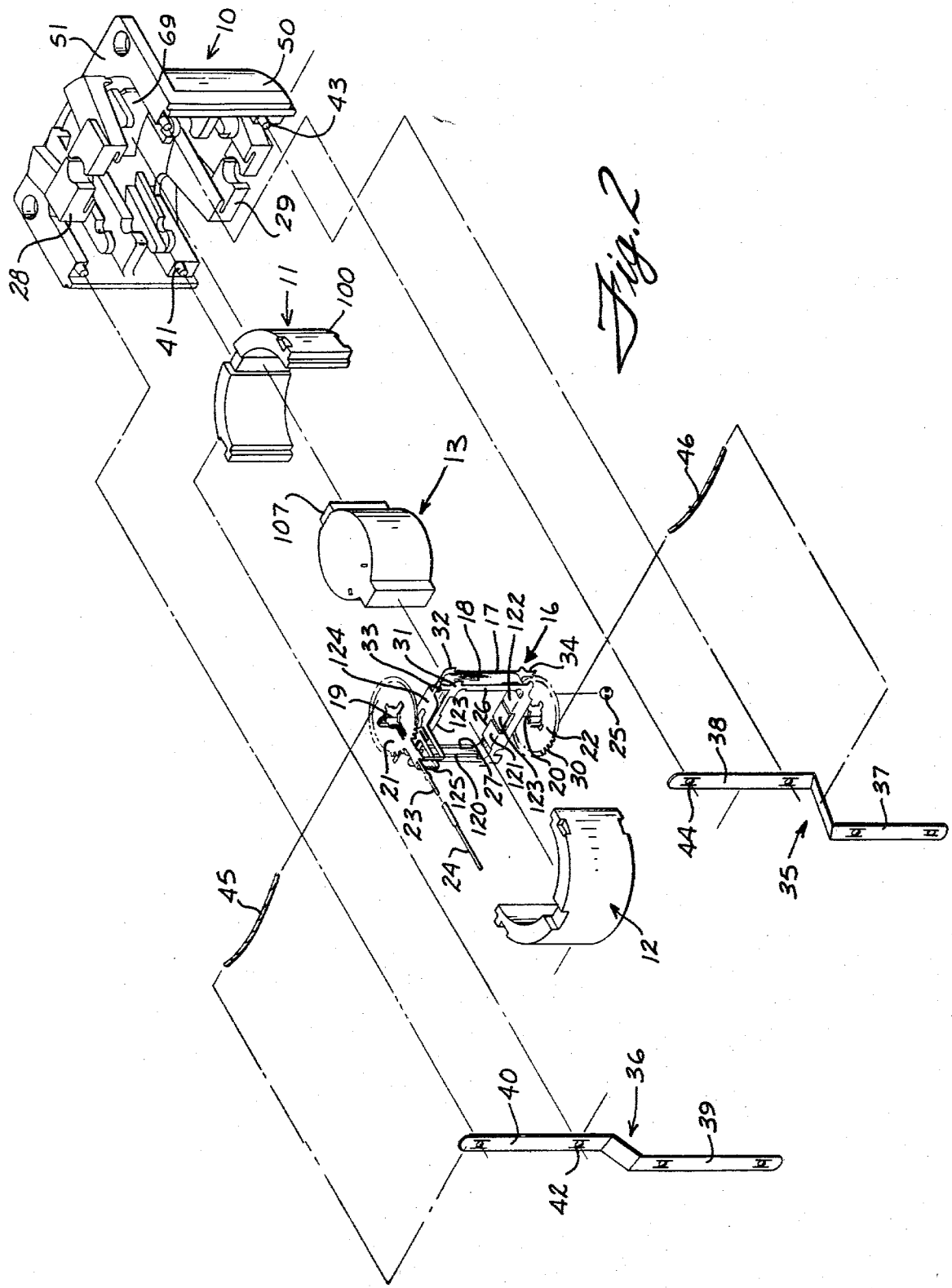
FIG. 2 is an exploded pictorial view of the meter movement of this invention and its supporting base.

FIGS. 1 and 2 show meter movement 3, and the manner in which the parts and sub-assemblies constituting the meter movement are assembled. A supporting base 10 supports all the components of mveter movement 3. The magnetic circuit for the meter includes a lower yoke element 11 which is essentially semicircular and an upper yoke element 12 which is identical to the lower yoke element and is merely the lower element turned 180° circumferentially. The yoke elements 11 and 12 are formed from soft iron or other magnetic material with magnetically nonretentive characteristics, and the yoke elements co-operate to form the usual yoke ring.

Positioned between yoke elements 11 and 12 is a permanent magnet 13. The contour of the surface of the permanent magnet 13 is such that generally crescent shaped gaps 14 and 15 are formed at each side of the magnet between the opposing surfaces of the yoke elements 11 and 12 (FIG. 1).

A moving coil assembly 16 includes a generally rectangular coil form 17 with a coil 18 wound on the coil form. The moving coil assembly is supported by taut bands 19 and 20 which are secured respectively to the front and rear of the coil assembly 16. The outer ends of the bands are secured respectively to gear toothed support elements 21 and 22. While a portion of this invention is directed to a meter having a coil suspended by taut bands, a quite similar coil assembly is used for a jewelled or pivot bearing version of the meter of this invention, as will subsequently be described in detail. Extending outwardly and upwardly from the front of coil assembly 16 is a staff 23 on which a hollow pointer 24 is mounted. At the rear of coil assembly 16 is a counter balance weight 25 which counterbalances pointer 24.

Yoke elements 11 and 12 are dimensioned and configured to snap into supporting base 10 in a manner which will subsequently be described in detail. The magnet 13 is maintained in a clamped position between the yoke elements, and the coil assembly 16 extends around the magnet such that its longitudinal sides 26 and 27 extend respectively through the gaps 14 and 15.

Front support element 21 is rotatably supported in a front support structure 28 of base 10 and rear support element 22 is rotatably supported in a rear support structure 29 of the base. The support elements 21 and 22 are each of integral construction and each have gear teeth 30 so a desired one of these elements can be directly engaged by the spur teeth of a zero adjust knob, such as the zero adjust knob 7 of FIG. 1 to rotate the appropriate support element to zero adjust the pointer 24.

Coil form 17 includes two initially identical coil form parts 31 and 32 of electrically conductive material such as phosphor bronze. One end of the coil 18 is connected to a terminal 33 on coil form part 31 whereas the other end of the coil 18 is connected to terminal 34 on the coil form part 32. These coil form parts 31 and 32 are in insulated relation to each other so the respective taut bands 19 and 20 which are electrically connected to the respective coil parts act as conductors and carry the current for energizing the coil 18. The support elements 21 and 22 are each formed from an electrically conducting material and are electrically connected to the respective taut bands 19 and 20. External electrical connections to the support elements 21 and 22 are made via the rigid terminal conductors 35 and 36 which are mounted on top of the base, and the terminal adaptor 6, when used. As shown at FIGS. 1 and 2, conductors 35 and 36 are each formed from flat strips of metal and have good electrically conducting characteristics. Terminal 35 is bent intermediate its ends to elevate rear leg 37 of the conductor relative to front leg 38. Identically, conductor 36 is bent intermediate its ends so rear leg 39 is offset from and above front leg 40.

A pair of conductor mounting posts 41 are provided at the top of base 10 and Tinnerman nut type openings 42 are formed in leg 39 so conductor 36 can be pressed over the posts to secure the conductor to the supporting base without the use of additional fasteners. Similarly, supporting posts 43 project upwardly from the other side of supporting base 10 to provide for connecting conductor 35 to the base by forcing posts 43 through openings 44 of leg 37. Conductor 35 is electrically connected to front support element 21 by a flexible braided wire conductor 45. Similarly, rear support element 22 is electrically connected to conductor 36 by a braided wire 46. The braided wires 45 and 46 have sufficient flexibility that support elements 21 and 22 can be rotated a sufficient amount, within predetermined limits, to zero adjust pointer 24.

B. THE SUPPORTING BASE

Base 10 is an integral structure molded from an electrically insulating plastic material with dimensionally stable characteristics, advantageously, a polysulfone material.

Figure 3:
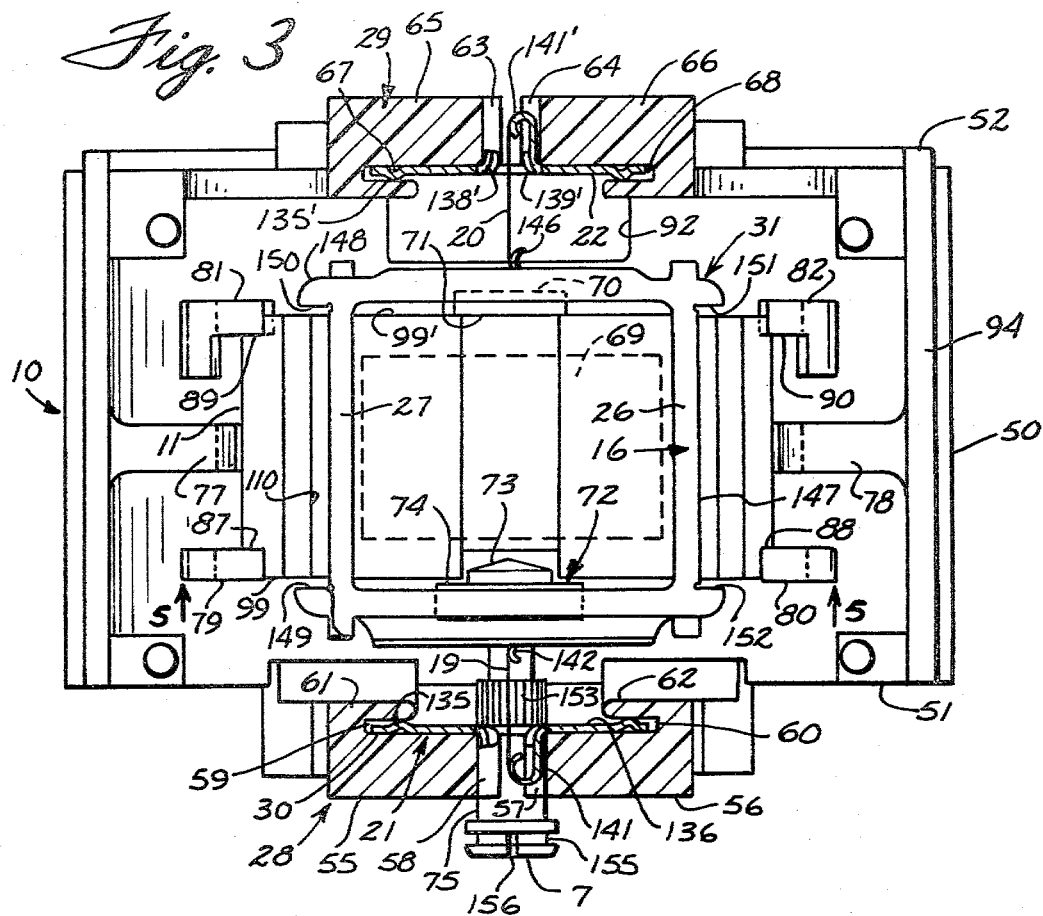
FIG. 3 is a top plan view of the meter movement and base with the upper yoke element and magnet removed and with portions of the base cut away for purposes of explanation.
Figure 4:
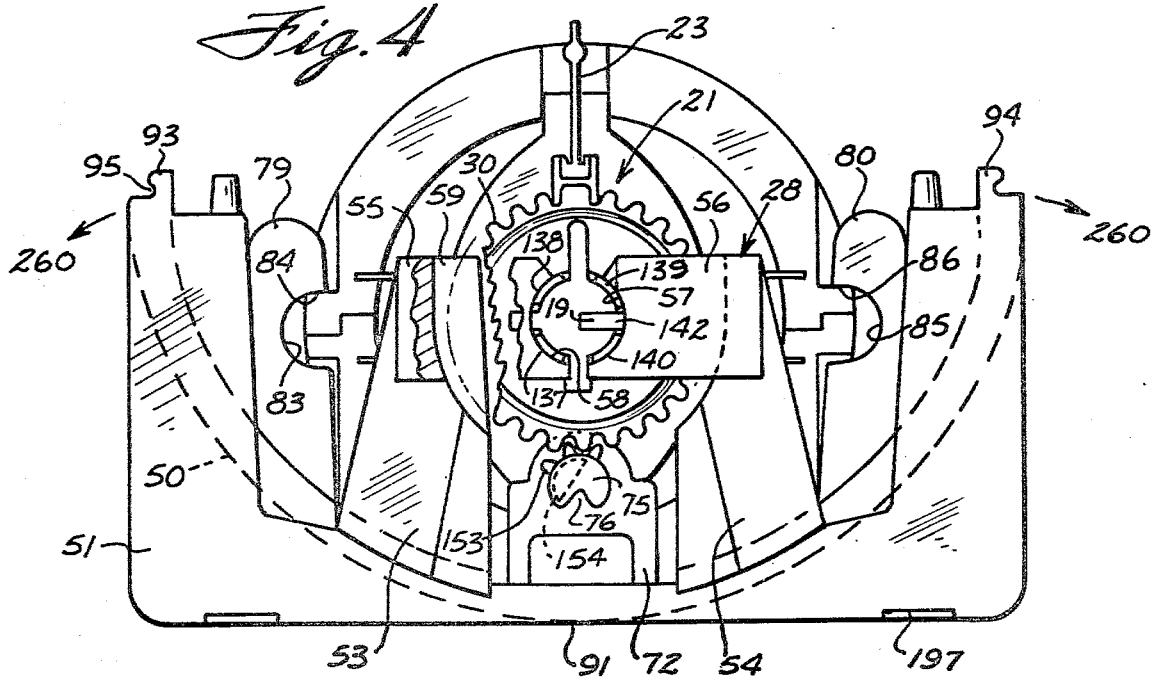
FIG. 4 is a front elevational view of the meter movement with portions of the base cut away.

As shown at FIGS. 2-4, base 10 has a generally semicircular hollow side wall 50 with a generally rectangular front flange 51. Front support structure 28 projects forwardly of front flange 51 and rear support structure 29 projects beyond end 52 of side wall 50. Front support structure 28 includes a pair of upwardly and inwardly directed integral legs 53 and 54. At the upper ends of these legs are inwardly extending horizontal blocks 55 and 56 which terminate in spaced relation to each other and have facing cylindrically curved surfaces 57 and 58 respectively each of which is greater than 90° in circumferential extent. Formed in the respective blocks 55 and 56 are arcuately curved recesses 59 and 60 which face each other and open upwardly to permit inserting front support element 21 downwardly into a seated position in the recesses, in a manner which will subsequently be described in detail. Recess 59 is defined in part by an upright inner wall 61 and recess 60 is defined in part by an opposed upright inner wall 62.

Rear support structure 29 is essentially the same as front support structure 28 and includes blocks presenting facing cylindrically curved surfaces 63 and 64 in the respective blocks 65 and 66, and recesses 67 and 68 to receive rear support element 22.

Figure 5:
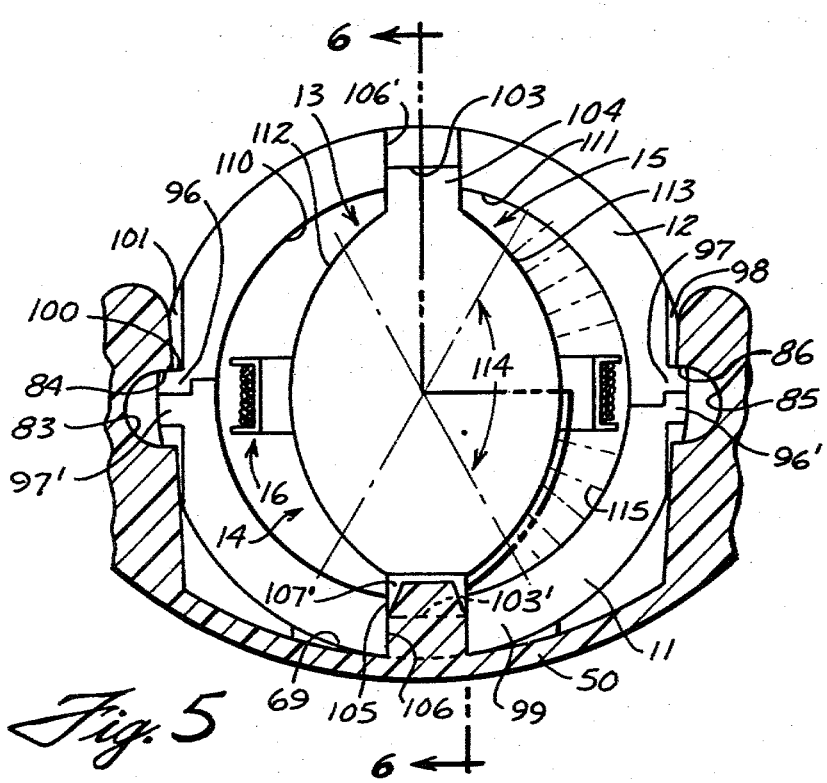
FIG. 5 is a front elevational view in section taken along line 5—5 of FIG. 3 and showing the magnetic circuit of the meter.

As shown at FIGS. 2, 3, and 5 the base also includes a curved yoke support pad 69 which projects upwardly from the bottom of side wall 50 to provide a seat to support lower yoke element 11. The pad 69 is located generally centrally of the supporting base and provides a seat for yoke element 11. Between pad 69 and rear support structure 29 is a rear positioning post 70. Rear post 70 projects upwardly to a level above pad 69 and presents a front surface 71 which engages magnet 13 and lower yoke element 11 to both position and prevent movement of these elements in a direction toward rear support structure 29. Between pad 69 and front support structure 28 is a front positioning post 72 which has a pointed positioning projection 73 which faces toward surface 71 of the rear post, and also has a pair of locating surfaces 74 on each side of projection 73. On the forward side of post 72 is a recess 75 which has a generally cylindrical side wall interrupted at its bottom by an upwardly projecting stop 76. Recess 75 and stop 76 cooperate with zero adjust knob 7 to limit the extent of rotation of the knob, in a manner which will subsequently be described in detail.

Extending inwardly from side wall 50 at a location approximately midway between the front and rear of the side wall, are a pair of transversely aligned reinforcing ribs 77 and 78 which add rigidity to the upper portions of the side wall. These ribs also function to clamp yoke elements 11 and 12 transversely as will later be described in detail.

Offset toward the front of side wall 50 and projecting upwardly from the side wall are a first pair of transversely aligned yoke retaining legs 79 and 80 which locate and secure yoke elements 11 and 12 in position on the supporting base 10. There are also a pair of transversely aligned rear yoke positioning and retaining legs 81 and 82 which project upwardly from side wall 50 and are offset toward the rear of the side wall. The locating and retaining legs 79-82 and the surfaces 71 and 74 of the positioning posts cooperate with the yoke elements and the magnet to both accurately position the magnet and yoke elements as well as to secure same to the base merely by pressing these parts into position. In this regard it will be noted that legs 79 and 81 each have arcuate recesses 83 formed therein which present a downwardly facing yoke retaining edge 84, and similarly, legs 80 and 82 include arcuate recesses 85 which present a downwardly facing yoke retaining edge 86. In addition, the respective legs 79-82 include longitudinally facing yoke retaining surfaces 87-90 which provide additional surfaces for locating and positioning the yoke elements within supporting base 10.

By virtue of its construction, the supporting base is somewhat flexible along the central portion 91 of the side wall between the legs 53 and 54, yet the remaining portions of the side wall outwardly of legs 53 and 54 are quite rigid by virtue of the bracing obtained from the ribs 77 and 78 and the legs 79–82. Such flexibility along the center of the side wall facilitates assembly as will subsequently be described.

At the bottom of wall 50 at a location offset toward end 52 is a generally rectangular recess 92 which opens rearwardly. This recess is provided to receive a forwardly projecting wall of case 4, as will subsequently be described. Projecting upwardly from wall 50 are longitudinal ribs 93 and 94. Each rib extends the length of the side wall as shown at FIG. 3 and has a groove 95 which seats in a mating projection in case 4 to hold the base against movement.

C. THE MAGNETIC CIRCUIT

Figure 6:
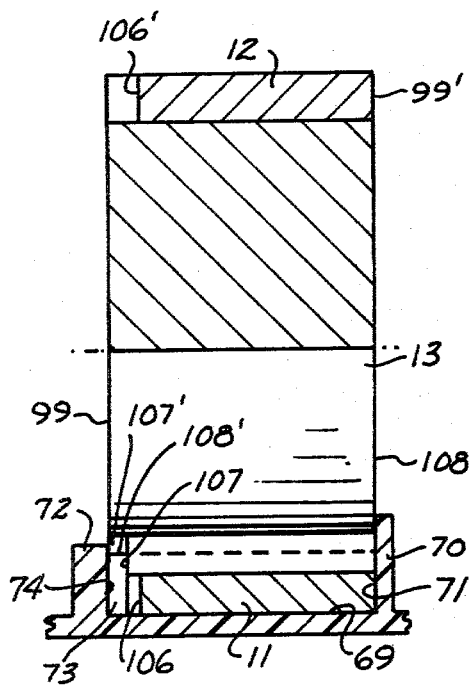
FIG. 6 is a side view in section taken along line 6—6 of FIG. 5.

FIGS. 5 and 6 show the magnetic circuit which includes the lower yoke element 11, the upper yoke element 12 and the magnet 13. Yoke elements 11 and 12 are formed from magnetic material which is non-magnetically retentive, such as soft iron and cooperate to form a diametrically split yoke ring. Magnet 13 is formed from a permanent magnet material, such as LODEX, and which is capable of being magnetized in a desired direction after the meter is assembled. As previously explained, yoke elements 11 and 12 are identical to each other to reduce the number of different parts needed for the meter.

As shown at FIG. 5, upper yoke element 12 is semicircular and has a step 96 which abuts a mating step 97' of lower yoke element 11. At the other side of the yoke ring, lower yoke element 11 has a step 96' which abuts a mating step 97 on upper yoke element 12. Since the yoke elements 11 and 12 are identical, the steps 96 and 96' are identical and the steps 97 and 97' are identical. Each yoke element has four notches 98. Two of the notches are formed in front face 99 of each yoke element, and two notches are formed in rear face 99' of each yoke element. Each notch presents a generally horizontal abutment surface 100 terminating at a vertical locating surface 101.

Formed in upper yoke element 12 is a horizontal slot 103 of uniform depth which extends the length of the yoke element. Lower yoke element 11 has an identical slot 103'. Magnet 13 is mounted between the yoke elements with its generally rectangular ends 104 and 105 seated respectively in the slots 103 and 103'. The yoke elements and magnet are so dimensioned that magnet 13 is clamped between yoke elements 11 and 12 when the yoke elements are seated in the base as shown at FIG. 4. In addition, the width of the rectangular ends 104 and 105 of the magnet is the same as in the width of the rectangular slots 103 and 103', so the magnet is maintained in precise alignment with the central axis of the yoke.

Formed in the front face 99 of the lower yoke element 11 is a vertical slot 106. End 105 of magnet 13 has a notch 107' to provide a locating surface 107. As shown at FIG. 6, when rear surface 108 of magnet 13 is flush with rear surface 99' of yoke elements 11, 12, locating surface 107 projects forwardly of the end of slot 106. Such dimensioning of the yoke elements and the magnet provides for seating lower yoke element 11 in base 10 with its rear surface 99' engaging locating surface 71 (FIGS. 3 and 6) of rear post 70 and with the surfaces of front face 99 at each side of slot 106 engaging the side surfaces 74 of front post 72. As shown at FIGS. 3 and 5, the locating projection 73 has a width which is less than the width of slot 106 so the projection 73 forms no locating function so far as the lower yoke element is concerned. However, projection 73 does engage locating surface 107 of the magnet to urge rear surface 108 of the magnet against surface 71 of post 70. In addition to providing the locating surface 107, the notch 107' provides for mounting magnet 13 in base 10 in only one position, namely the position shown at FIG. 6 where the notch is adjacent the front locating post 72. As shown at FIG. 6, the top edge 108' of the projection 73 of post 72 prevents installing the magnet in any other position, such as upside down or with the notch 107' facing toward rear post 70. Upside down installation of the magnet is not possible because there is no notch in the upper rectangular end 104 of the magnet and hence, the end will not fit between posts 70 and 72. If the magnet is turned so the notch 107' faces toward rear post 70, it is impossible to seat the magnet because the rear post is higher than notch 107'. In addition, the projection 73 permits installing lower yoke element 11 only with slot 106 adjacent front post 72. The steps 96, 96', 97, 97' permit seating the upper yoke element on the lower yoke element only with slot 106' facing the front of the base. Hence, the magnet is always installed in the same position in successively constructed meters and correspondingly, repeatable accuracy of the meters is assured.

By virtue of this arrangement, both magnet 13 and yoke elements 11 and 12 are precisely positioned in a fore and aft direction on base 10. Since the posts 70 and 72 are each relatively rigid fore and aft movement of the magnet relative to the yoke elements is prevented. In addition, the respective locating faces 87–90 of legs 79–82 engage the vertical surfaces 101 of notches 98 in the upper yoke element, whereas the yoke retaining edges 84 and 86 of the respective legs extend across the horizontal abutment surfaces of yoke element 12 to clamp the yoke elements against pad 69. By virtue of this arrangement, the yoke elements and magnet are precisely located on base 10 and are securely held in a predetermined position on the base by the simple expedient of pressing the magnet and yoke elements downwardly into the base to the position shown at FIGS. 5 and 6.

Yoke elements 11 and 12 cooperate to form a yoke ring of uniform cross-section which has inwardly facing cylindrical surfaces 110 and 111 on each side of magnet 13. The sides of the generally elliptical magnet 13 presents arcuately curved outwardly facing surfaces 112 and 113. The surfaces 112 and 113 are not precisely cylindrical, but instead are so curved that the crescent shaped flux gaps 14 and 15 each have a uniform flux density therein throughout the angle 114. This angle is on the order of 110° and represents the range of pivotal movement of coil assembly 16. As is apparent, the flux lines 115 in the gap 15 are uniformly spaced, as are the flux lines in the gap 14. This assures that sides 26 and 27 of the coil assembly are each cut by the same number of flux lines, and that the flux density, in each of gaps 14 and 15 is essentially the same.

It is to be appreciated that the flux density in these gaps need not really be the same to provide for linear deflection of the coil assembly. For such linear deflection, it is, however, quite significant that the sum total of flux which cuts the sides 26 and 27 of the coil assembly be substantially the same for any position of the coil assembly within its effective range of pivotal movement. By so construction the magnet and yoke elements that the sum total of the flux tending to rotate the coil assembly is the same regardless of the angular position of the coil assembly, linear deflection characteristics are obtained. Hence, when coil 18 is energized, the forces acting to rotate the coil assembly are linear and since the forces exerted on the coil by the taut bands 19 and 20 to resist rotation are also linear, the deflection of the coil is linear and in direct proportion to the energizing current in the coil. This arrangement assures a quite accurate linear deflection of the coil with attendant economies related to the decrease in cost of and the number of scale plates required for the assembled meter.

D. THE COIL ASSEMBLY AND TAUT BAND SUPPORT

As previously explained with reference to FIG. 2, coil assembly 16 includes a coil form 17 comprised of an upper coil form part or half 31, and a lower coil form part or half 32 with a coil 18 mounted on the coil form. Initially the coil form parts 31 and 32 are identical. However, subsequent operations are performed on these coil form parts so there are differences at the time the coil assembly is installed in the base 10.

Figure 14:
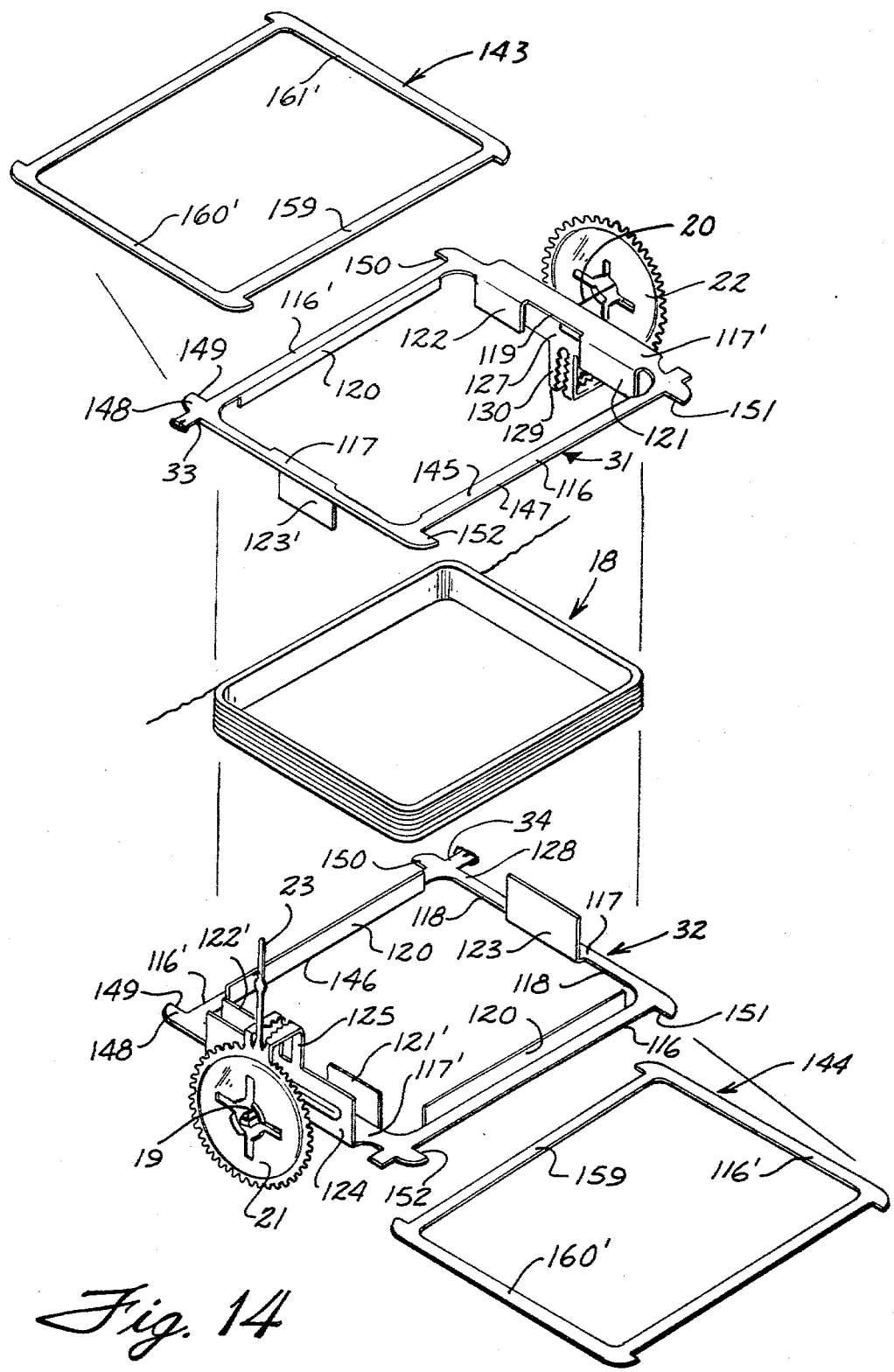
FIG. 14 is an enlarged exploded pictorial view of the coil assembly.

Both the upper and lower coil form parts 31 and 32 take the form of a hollow generally rectangular frame as shown at FIGS. 2, 3 and 14. Integral with upper coil form part 31 is the rear support element 22 and integral with lower coil form part 32 is the front support element 21. The various portions of the upper and lower coil form parts are initially integral with each other and are of the same thickness. This construction permits forming the respective parts from an initially flat uniform thickness sheet of metal with spring characteristics such as phosphor bronze.

As shown at FIG. 14, the rectangular frame portion of upper coil form part 32 includes parallel side legs 116 and 116', a first end leg 117 which extends between the legs 116 and 116' at one end of the frame, and a second end leg 117' which extends between the legs 116 and 116' and at the other end of the frame. Since the lower coil part 32 has a rectangular frame portion which is merely the upper coil form part turned over end to end, the corresponding legs of the lower coil form part are designated by the same numerals 116, 116', 117, and 117'. The legs of the respective coil form parts are coplaner with each other. The openings defined by the legs 116, 116', 117, and 117' of the coil form parts are of the same size and are sufficiently large to extend around the magnet 13.

Projecting downwardly from the respective legs 116 and 116' of upper coil form part 31 are elongated coil engaging flanges 120. Projecting upward from the respective legs 116 and 116' of lower coil form part 32 are elongated coil engaging flanges 120. These flanges of the respective coil form parts project toward each other in the same plane but have their end edges spaced apart as shown at FIG. 2. Upper coil part 31 has a pair of spaced apart tabs 121 and 122 (FIGS. 2 and 14), which project downwardly from leg 117' to the plane of lower coil part 32, and which extend into the recesses 118 of the lower coil part and terminate in spaced relation to the side edges of these recesses. Projecting upwardly from the leg 117 of lower coil part 32 is a tab 123 which extends into the recess 119 between tabs 121 and 122 but does not engage the sides of the recess so tab 123 is electrically insulated from upper coil part 31. The arrangement at the front of coil assembly 17 is the reverse of the tab arrangement at the rear, there being a downwardly projecting central tab 123' on leg 117 of upper coil part 31 which projects downwardly between tabs 121' and 122' of lower coil part 32. By virtue of this configuration all portions of the upper coil part 31 are in spaced relation to all portions of the lower coil part 32 so these parts are in insulated relation to each other. The coil form parts are typically held together by the coil 18 of insulated wire, using for example, a suitable insulated bonding material.

Integral with leg 117' of lower coil part 32 is an upwardly projecting staff support plate 124 of substantial width. The staff support plate 124 is located in a plane in front of the outside edge of leg 117 of coil part 31 and has a pair of integral upwardly projecting legs 125 the inside edges of which are toothed, and which legs project first upwardly in the same plane as staff support plate 124, and then forwardly to mount staff 23 in a plane which includes front support element 21. It is to be appreciated that the staff is integral with the lower coil part 32, and initially, as shown in FIG. 14, support element 21 is also integral with the lower coil form part.

Figure 7:
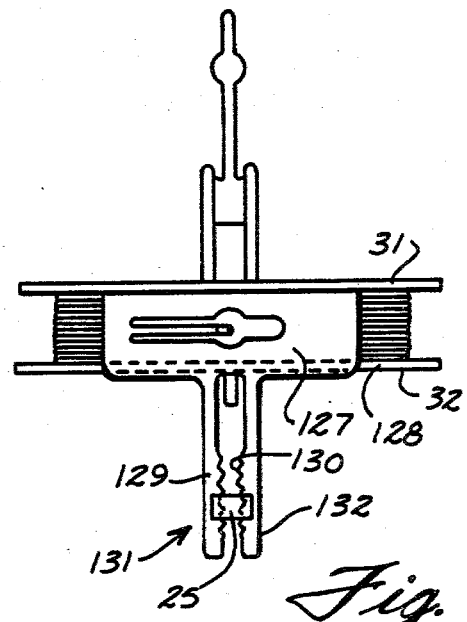
FIG. 7 is a rear view of the coil form assembly of the meter and shows the tail and counterbalance weight for the coil assembly.

Projecting downwardly from the outside edge of leg 117 of upper coil part 31 is an integral rear support plate 127. Plate 127 is in a plane spaced behind the outside edge 128 of leg 117 of lower coil form part 32. Extending downwardly from plate 127 are a pair of spaced apart legs 129 (FIGS. 7 and 14) provided with serrated edges or teeth 130 in facing relation along a portion of the length of the legs. Initially, legs 129 extend downwardly and then rearwardly and are integral with rear support element 22.

As will subsequently be described in detail, rear support element 22 is severed from legs 129 shortly before insertion of the coil assembly into base 10. Then, the legs 29 are straightened to provide a structure for receiving counter weight 25 between the teeth 130. The teeth 130 provide a means for securing counter weight 25 in position on the tail 131 provided by the legs 129. In addition, front support element 21 is severed from legs 125 shortly before insertion of the coil assembly into base 10.

The counterweight 25 (FIG. 7) takes the form of a disc of heavy material like lead which has slots 132 along its opposite sides to permit mounting the counterweight by sliding it upwardly between the legs 129. The counterweight is secured in the desired position by squeezing it so some of its material is forced into the spaces between teeth 130.

By virtue of this construction of the coil assembly, upper coil form part 31 is in insulated relation to lower coil form part 32. One end of coil 18 is connected to terminal 34 of lower coil part 32 and the lower coil part is electrically connected to the front support element 21 by the taut band 19. The other end of coil 18 is connected to terminal 33 of upper coil form part 31 and the upper coil part is electrically connected to the rear coil support element 22 by taut band 20.

As previously mentioned the coil form parts as well as front support element 21 and rear support element 22 are formed from thin electrically conducting material with springy characteristics, such as phosphor bronze. As shown at FIG. 3, support element 21 has an annular rearwardly projecting embossed ring 135 just inwardly of gear teeth 30. Ring 135 is sufficiently deep that it engages the walls 61 and 62 of the recesses 59 and 60, in which the support element is mounted. Ring 135 functions to press the support element forwardly into engagement with front surface 136 to frictionally retain the support element against inadvertent or accidental rotation but permits rotational adjustment of the support element. Projecting forwardly from the inner portion of support element 21 are four centering lugs 137–140 (FIG. 4). These lugs are each of arcuate curvature and have their outer surfaces concentric with the geometric center of the support element. The outer surfaces of these lugs have the same radius of curvature as, and engage the arcuate surfaces 57 and 58 of support structure 28 to maintain the support element in a precisely centered position. Extending from between lugs 139 and 140 is an integral taut band support finger 141 which projects forwardly and then curves inwardly so taut band 19, which is secured to finger 141, extends precisely along the axis of support element 21. The inner end of taut band 19 is connected to a support finger 142 integral with support plate 124 of lower coil form part 32.

During the initial stages of construction of coil form 17, upper coil part 31 is identical to lower coil part 32. Correspondingly, rear support element 22 is identical to front support element 21 and includes an embossed ring 135' (FIG. 3) as well as centering lugs 137'–140' which provide for rotational adjustment of rear support element 22 but maintain the rear support element in precisely concentric relation to the axis of the arcuate surfaces 63 and 64 of rear support structure 29 of the base. FIG. 3 shows the position of rear support element 22 with the centering lugs 138' and 139' in position on the surfaces 63 and 64. The outer end of rear taut band 20 is welded to a taut band support finger 141' integral with rear support element 22, and the inner end of rear taut band 20 is welded to a taut band support finger 142' integral with rear support plate 127.

As shown at FIG. 3, the side edges 147 of sides 26 and 27 of the coil assembly are spaced only slightly from the inside surface 110 of lower yoke element 11. In addition, each coil form part has at its corners transversely projecting lug portions 148 which provide stop surfaces 149–152 (FIGS. 3 and 14). These stop surfaces cooperate respectively with the front surface 99 and rear surface 99' of yoke elements 11 and 12 to limit the extent of fore and aft movement of the coil assembly, should the meter be subjected to shock or impact. The stop surfaces 149–152 and side edges 147 are so positioned relative to the front, rear, and inside surfaces of the yoke elements that the elastic limit of taut bands 19 and 20 is not exceeded regardless of the direction of shock or impact on the meter. In the event of transverse shock, edges 147 of the side legs 26 and 27 are sufficiently close to the inside surface of the yoke elements that these legs will engage the surface before the elastic limit of either of the taut bands is exceeded. By virtue of this arrangement, the meter movement is virtually indestructible so far as damage to the taut bands from shock or impact is concerned.

By virtue of the torsional effect of taut bands 19 and 20, rotating either front support element 21 or rear support element 22 changes the at rest position of coil assembly 16, and correspondingly provides for adjusting the coil assembly and pointer to a zero position. Hence, support elements 21 and 22 can also be termed zero adjust elements. Adjustment of the zero position is preferably accomplished by the zero adjust knob 7 which has gear teeth 153 which mesh with the gear teeth 30 on front support element 21. The adjusting knob is provided with a semi-cylindrical rear tip 154 which extends into recess 75. The extent of rotation of the knob is limited by engagement of this tip with the stop projection 76 within the recess 75. The head of knob 7 has an annular recess 155 and cross slots 156 to enhance the resiliency of the head so it can be snapped into the opening 8 in cover 2, whereupon the knob is retained by the inwardly projecting bead 157 in the opening 8.

D1. The Damping Rings

Figure 15:
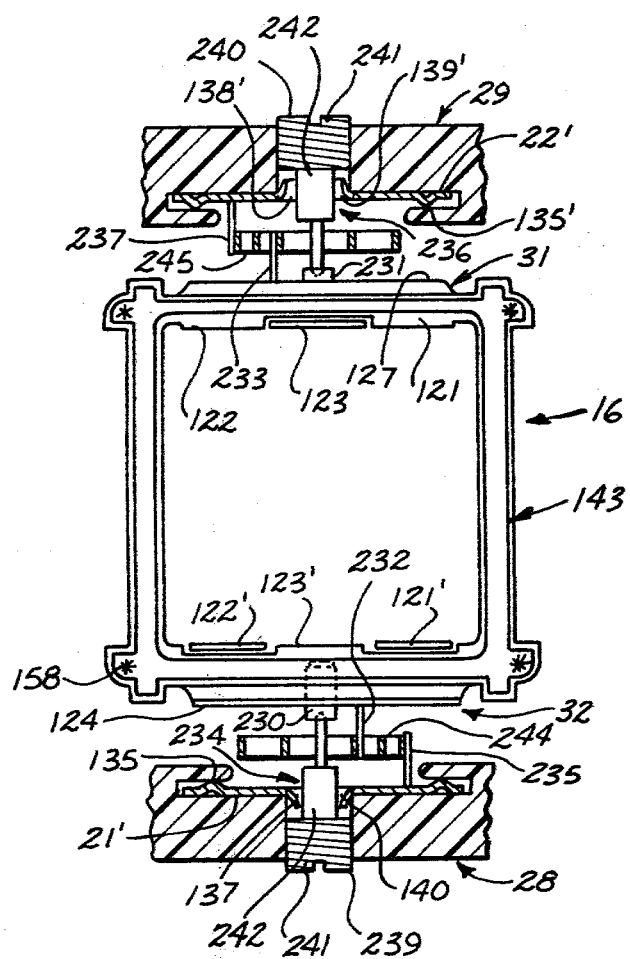
FIG. 15 is an enlarged partial top plan view showing a pivot bearing support arrangement for the meter.

An optional feature of the meter of this invention resides in the use of damping rings to decrease the rate of deflection of coil assembly 17 when coil 18 is energized. As shown in FIG. 14, two damping rings 143 and 144 can be provided. Damping ring 143 is placed on top of the flanged flat upper surface 145 of upper coil part 31 whereas damping ring 144 is placed on the bottom of the flanged flat lower surface 146 of lower coil part 32. These damping rings are welded respectively to the upper and lower coil parts for example, by use of spot welds 158 as shown at FIG. 15.

Damping rings 143 and 144 are identical to each other and have a configuration which is generally the same as the configuration of the upper and lower surfaces of the respective coil form parts 31 and 32. However, the respective sides 159 front 160' and rear 161' are slightly narrower than the configuration of the corresponding portions of the upper and lower coil form parts. Hence, as shown at FIG. 15, the damping rings have their side edges located respectively inwardly of the respective flanged surfaces of the coil form parts. By so dimensioning the damping rings 143 and 144 that their edges are inwardly of the respective edges of the coil form parts, damping rings of a desired thickness and damping capability can be added to the coil assembly without interfering in any way with the movement of the coil assembly. An additional significant feature of the dimensioning of the damping rings is to be observed with reference to FIG. 15 which also shows that the inner edges of the front 160' and the rear 161' of the damping rings are spaced outwardly of the respective tabs of the coil form parts to assure that the damping rings do not electrically connect the coil form parts together.

The damping rings are each formed from copper or other metal with good electrically conducting characteristics and which is also weldable. For simplicity of construction each of the damping rings is flat and has a uniform thickness. Similarly, each element of each coil form parts 31 and 32 is of the same thickness to simplify manufacture. Correspondingly, damping rings of the desired thickness can be readily added optionally for damping the deflection of the coil when the coil is energized.

E. THE POINTER

Pointer 24 is formed from a plastic material with memory characteristics such that the pointer will straighten even if the current to the coil is sufficiently high that the pointer strikes a stop with sufficient force to bend the pointer. In addition, the material of the pointer is corrosion resistant and non-moisture absorbing. Correspondingly, there can be no changes in weight of the pointer which could adversely affect the balance of the moving coil assembly. A preferred material for the pointer is a polysulfone plastic which has the advantageous properties set forth above.

Figure 8:
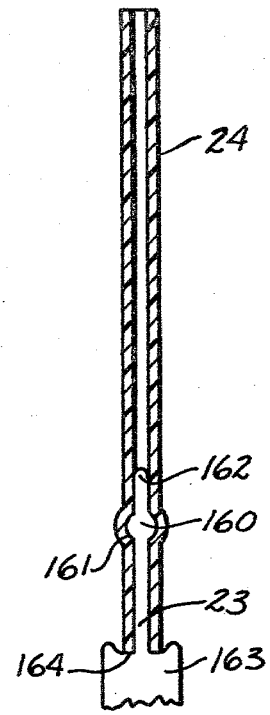
FIG. 8 is an enlarged view in vertical section showing the pointer support staff and a preferred pointer for the meter.

FIG. 8 shows a preferred embodiment of pointer 24 and staff 23 of the moving coil assembly on which the pointer is mounted. Staff 23 has an enlarged projection 160 with rounded sides 161. The projection 160 is located between the ends of the staff and the upper end of the staff has a tip 162 which is also rounded so pointer 24 can be forced over the staff to mount the pointer on the moving coil assembly. By virtue of the resiliancy and memory characteristics of the polysulfone material of pointer 24, no cements or adhesives are required to retain the pointer on the staff. The resiliancy and memory characteristics of the material of the pointer are sufficient to frictionally hold the pointer in position on staff 23.

As is apparent with reference to FIG. 8, pointer 24 takes the form of an elongated tube of uniform wall thickness. A tube of a diameter on the order of 0.025 inches with a wall thickness on the order of 0.003 inches provides for an extremely light weight and durable pointer which is easy to mount on the coil assembly and no cementing or crimping is required to retain the pointer in its mounted position. Advantageously, staff support plate 163 provides stop edges 164 at each side of staff 23 to limit the extent that the pointer can be pushed into position on the staff. The stop surfaces assure that the pointers of successively assembled meters will all be in the same position on the coil assembly, and this feature contributes to repeatable accuracy of the assembled meters.

F. THE CASE AND SCALE

Case 4 is molded from an optically clear plastic material such a polystyrene. With reference to FIGS. 1 and 9-11, case 4 includes a face plate 166 and an integrally formed body 167 extending rearwardly from the face plate. Face plate 166 is generally rectangular and has a shallow recess 168 formed in the upper portion of its rear surface 169 to receive scale 5. The recess 168 is wholly within the top and side edges of face plate 166 so scale 5 assumes a recessed position on the rear of the face plate as shown at FIG. 11.

Scale 5 is precisely positioned in recess 168 by integrally formed cylindrical locating pins 170 which project rearwardly from face plate 166 and are received in locating openings 171 in the scale. A pair of retaining lugs 172 project downwardly from the upper edge of recess 168 to hold the upper edge of scale 5 in position in the recess. In addition, there are pairs of lugs 173 and 174 which engage the lower edges of scale 5 at four spaced apart locations to retain the lower edge of the scale in position in the recess. The several lugs 172-174 are all integrally formed with face plate 166 and the scale is provided with a downwardly opening recess 175 to accommodate body 167 of case 4.

To mount and connect scale 5 to the rear of face plate 166, it is merely necessary to align opening 171 with the locating pins 170 and then press the face plate over the retaining lugs 172-174 and into recess 168. The retaining lugs secure the scale to the rear face of the face plate, but the scale can readily be removed so a different scale can be used with the meter simply by inserting a tool in the notch 177 at the lower corner of the recess, whereupon the scale 5 can be pried away from the rear of the face plate. Alternatively, scale 5 can be mounted on the front surface of face plate 166. For front mounting face plate 166 has integral locating pins 176 aligned with the pins 170. Since a front mounted scale will not be removed, the scale is also connected in position after it is aligned with the pins 176 in its openings 171.

Advantageously, scale 5 is formed from a flat sheet of high impact polystyrene on the order of 1/32 inch thick. This provides a scale which is flexible so it can be readily snapped into position in the recess, yet is sufficiently rigid that it will not bend or bow. The sheet from which scale 5 is formed may be semi-transparent or translucent so the meter scale can be backlighted.

As shown at FIGS. 1 and 9-11, body 167 has a flat top wall 178 and side walls 179 and 180 which project downwardly from the top wall. There is also a rear wall 181 of slightly greater than semi-circular outline. A semi-circular flange 182 projects forwardly from rear wall 181. At the bottom of flange 182 is a forwardly projecting tab 183. Formed on the side walls 179 and 180 are ratchet type teeth 184 which face toward face plate 166 and provide for gripping a snap-on type retaining nut 185 (FIGS. 12 and 13) to facilitate mounting the meter on the front face of a panel.

Formed in the top edge of face plate 166 are a pair of notches 186 and formed at the bottom edge of the face plate are a pair of notches 187. As shown at FIG. 1, face plate 166 has a semi-circular opening 189 formed therein, the lower edge of which is defined by a wall 190 with a concave top edge. Extending from the front surface of the face plate to the wall 190 is a recess 191 with square lower corners. The bottom edge of the recess is notched to accommodate a pair of resilient, forwardly projecting latch fingers 192 integrally formed with case 4.

At the sides of opening 189, adjacent the upper portion of the opening are tracks 193 and 194 dimensioned to mate respectively with ribs 93 and 94. Tracks 193 and 194 extend the length of body 167 and permit sliding the base and meter movement into a seated position in the case. Horizontally elongated openings 195 and 196 are provided in rear wall 181 to receive conductors 35 and 36 of the meter movement 3.

The top of wall 178 of body 167 is provided with a step 198 in its rear edge as shown at FIGS. 9 and 10. This step terminates slightly above the openings 195 and 196. The openings 195 and 196 are each defined by an L-shaped notch 199 which extends through both the top wall 178 and rear wall 181. In addition, it will be observed with reference to FIG. 9 that the body 167 has upwardly projecting longitudinally extending ribs 201 along the opposite sides of top wall 178. Step 198 and ribs 201 provide a seat for conveniently mounting adapter assembly 6 on top of body 167. The rear of body 167 is provided with a thickened portion centrally thereof in which a blind opening 202 is formed to receive the screw 9 for securing the terminal adapter 6 to the casing.

To mount meter movement 3 in case 4, it is merely necessary to align ribs 93 and 94 at the top of base 10 with the tracks 193 and 194 of the case. The conductors 34 and 36 carried by the base 10 are substantially rigid and are accurately positioned on the base in alignment with the openings 195 and 196 respectively in rear wall 181. Hence, the assembled meter movement can be readily slipped into a seated position in the base merely by sliding the meter movement rearwardly until notches 197 on the bottom surface of the base snap over the retaining fingers 192 adjacent the front of the case 4. In this seated position of the meter movement, the rear face of flange 51 abuts the front face of wall 190, conductors 35 and 36 extend through the respective openings 195 and 196 in rear wall 181, and tab 183 seats in the recess 92 at the rear of the base. The position of the meter movement in the case 4 is shown at FIG. 12, where it is seen that the front support structure 28 projects slightly in front of the front surface of face plate 166. Side wall 50 of supporting base 10 forms a close fit with body 167 and tab 183 of the case to prevent dust from entering the assembly. In this regard, it will be observed with reference to FIGS. 10 and 11 that tab 183 has a flanged edge 203 which seats in a mating recess formed in the rear surface 52 of the base along the side edges of the recess 92 of the base.

G. THE COVER

Cover 2 is formed fron an optically clear plastic material such as polystyrene. As shown at FIGS. 1 and 12, cover 2 is generally rectangular and has a side wall 188 of a size to fit over face plate 166. The rear of side wall 188 has a rectangular recess with an inner edge 205 that forms an abutment surface against which the front surface of face plate 166 abuts when the cover is in position on the face plate. Formed at the rear edge of the cover are pairs of locking lugs 206 and 207 which are spaced apart and arranged to snap over the pairs of notches 186 and 187 of the face plate so the cover can be quickly snapped into position on the face plate and yet is held against accidental removal. As shown at FIG. 12 the rear edge 208 of side wall 188 is flush with the rear surface of face plate 166.

The zero adjust knob 7 is snapped into position in the cover before the cover is snapped onto the face plate. Opening 8 in the cover is so positioned that the teeth 153 of the zero adjust knob will mesh with the teeth 30 of front support element 21 when the cover is in position. In addition, the rear tip 154 of the zero adjust knob 7 will be within the recess 75 which functions as a bearing for this rear tip, and also limits the extent of rotation of the knob because of the stop 76.

H. THE PANEL MOUNTING ARRANGEMENT

The assembled meter 1 is particularly adapted to be mounted on a flat mounting panel 211 which has a circular opening 212 to receive the body 167 of the case as shown at FIGS. 12 and 13. In addition, the panel 211 is advantageously provided with a pair of locating openings 213 spaced apart the same distance as scale locating pins 170 formed on the rear face of face plate 166. When pins 170 are inserted in the openings 213 the meter assembly is oriented in a predetermined angular position and cannot be turned.

If desired, the terminal adapter 6 can be mounted on the top wall of body 167 between ribs 201. Terminal adapter 6 is hollow to provide space for additional circuit components such as a rectifying bridge where the meter is used to measure alternating current. The adapter 6 is secured to body 167 by threading the screw 9 into the opening 202 (FIG. 10) at the rear of the body. The single screw 9 holds the adapter securely because ribs 201 prevent the adapter from shifting.

The electrical connection between the meter movement and adapter 6 is also quite simply accomplished by bending the conductors 35 and 36 which extend through the respective openings 195 and 196 upwardly and then over top wall 178 so these conductors are within the body of adapter 6. Electrical connections between the conductors 35 and 36 and the circuitry within adapter 6 can be accomplished by welding before the conductors are bent.

As shown at FIG. 13 adapter 6 has a pair of downwardly projecting tabs 214 which close the openings 195 and 196 against entry of dust and dirt into the meter casing. The rear wall of the adapter has a downwardly extending lip which seats in step 198 and provides for accurate positioning of the adapter on the body.

Meter assembly 1 is secured to panel 211 by the nut 185. Nut 185 is generally rectangular and has an opening 215 formed therein. Opening 215 has parallel side edges 216 the distance between which is only slightly greater than the width of body 167 as measured between the base portions of the teeth 184. In addition, the straight edges 216 each merge with arcuately curved edges 217 of the opening, the edges 217 being spaced apart a distance greater than the width of the body across the tips of the teeth. On the front face of the nut 185 are spacer buttons 218 which space the corners of nut 185 from rear surface 219 of panel 211. These buttons have a thickness slightly greater than the pitch of the teeth 184 to permit pressing the portions of the nut which engage teeth 184 toward rear surface 219 of the panel so the meter assembly is tightly held against the panel even though there are variations in the thickness of the panel on which the meter assembly is mounted. Hence, the spacer buttons assure that the rear surface of the face plate firmly abuts the front face of panel 211. The meter assembly can be quite simply released from its panel mounting merely by rotating nut 185 so the curved edges 217 are opposite teeth 184. In this position of the nut the teeth are completely disengaged from the nut and the meter can be removed by pushing same forwardly through the opening 212. Since nut 185 does not engage adapter 6, the nut can be used to mount the meter whether or not the adapter is used.

Where it is not desired to use zero adjust knob 7 at the front of the meter assembly, the knob 7 can be inserted through rear wall 169 of body 167. This is also quite simply accomplished because rear wall 181 is provided with a recessed opening 220 which is normally closed by a removable integral knockout plug (FIG. 9). Removing the knockout plug provides for mounting the zero adjust knob in rear wall 181 by snapping the knob into position from the inside of body 167 before the meter movement is placed in the base. The position of the knob in the rear wall is shown at FIG. 13.

H. THE PIVOT BEARING ARRANGEMENT

Figure 17:
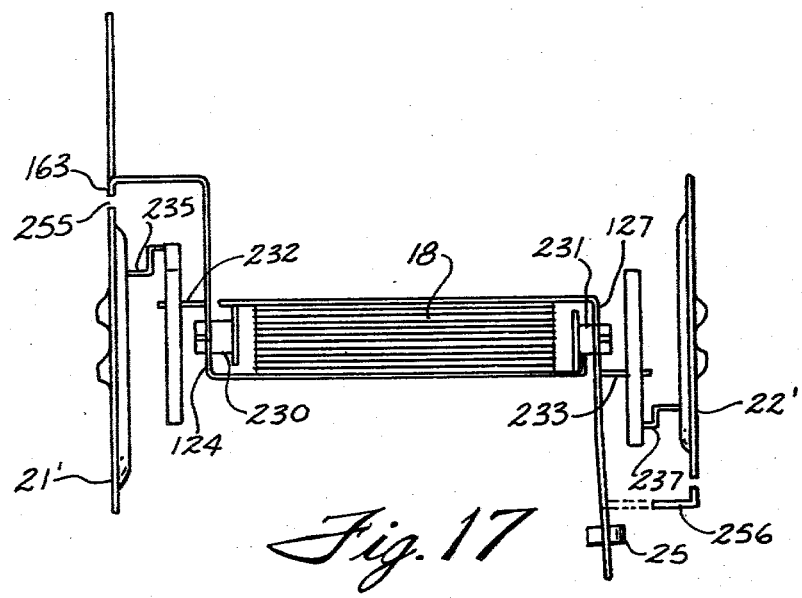
FIG. 17 is a side elevational view of the pivot bearing supported coil assembly immediately before insertion into the base.

The meter thus far described has been one in which the coil assembly is suspended for pivotal movement by taut bands 19 and 20. A second version of a pivotal mounting for coil assembly 16 is the pivot bearing arrangement of FIG. 15. While FIG. 15 shows a top view of the coil assembly with the magnet, yoke pieces, and portions of the base deleted, it is to be understood that base 10 and the magnetic circuit including magnet 13 and the upper and lower yoke elements 11 and 12 are identical to those previously described for the taut band suspension version of the meter. With reference to FIG. 15 it will be observed that the upper and lower coil form parts 31 and 32 are essentially the same as the coil form parts previously described save that there are some minor modifications. These modifications are best explained with reference to FIGS. 3, 15 and 17. Front plate 124 of lower coil form part 32 is modified by deleting the taut band support finger 142 (FIG. 3) and providing an opening to receive and retain a pivot bearing 230 (FIGS. 15 and 17). Similarly, rear support plate 127 of upper coil form part 31 has its taut band support finger 146 deleted and is provided with an opening to receive and retain a rear pivot bearing 231.

An additional modification to front plate 124 is the provision of an integral tab 232 (FIGS. 15 and 17)

which projects toward front support structure 28 of the base. There is also a tab 233 which projects toward rear support structure 29 and is integrally formed with rear plate 127.

The front support element 21' and rear support element 22' of the pivot bearing version of the meter are modifications of the support elements for the taut band version of the meter. Front support 21' is initially integral with lower coil form part 32 and rear support 22' is initially integral with upper coil form part 31, as is apparent with reference to FIG. 17. As will be apparent from the following discussion, the support elements 21' and 22' are more aptly termed zero adjust elements. Front element 21' is quite similar to the front support element 21, previously described. In this regard, there is an annular ring 135 which functions to frictionally restrain front element 21' from rotation, and there are also centering lugs 137–140 which center front element 21' in front support structure 28 (only the centering lugs 137 and 140 are shown at FIG. 15). The taut band support finger 141 (FIG. 3) of support element 21 is deleted in the case of support element 21' to provide an opening 234 (FIG. 15) through the center of support element 21'. In lieu of the previously described taut band support finger 141, front element 21' has an integral tab 235 which extends toward coil assembly 16. Similarly, in the case of rear element 22' there are centering lugs 138' and 139' which have an opening 236 therethrough and an integral tab 237 projects from the rear support element toward coil assembly 16.

The coil assembly of FIG. 15 is supported for pivotal movement by pivot studs 239 and 240. Pivot stud 239 has a pointed inner end which seats in a conical depression in the outer end of front pivot bearing 231 and similarly, pivot stud 240 has a pointed inner end that seats in a conical depression in the outside end of rear pivot bearing 230. The enlarged head 241 of both the pivot studs is external threaded and is of a diameter to be threaded into the opening defined by the curved surfaces 57 and 58 of front support structure 28 as well as into the opening defined by the curved surfaces 63 and 64 in rear support structure 29. The portion 242 of each stud which extends through the respective openings 234 and 236 is smaller than the opening so the front and rear elements 21' and 22' do not engage pivot studs 239 and 240 and hence, the studs do not interfere with rotation of the support elements 21' and 22' during adjustment of the zero position of coil assembly 16. In lieu of the bearing arrangement shown at FIG. 15 the ends of portions 242 of the studs can be provided with conical depressions to provide bearings, and shafts or studs with pointed tips can be fixed to coil assembly 16 in place of the bearings 231 and 234.

A spirally wound front leaf spring 244 is connected between front support element 21' and lower coil form part 32 by welding the inner end of the spring to tab 232 and by welding the outer end of the spring to tab 235. Similarly, a spirally wound rear leaf spring 245 is both mechanically and electrically connected between rear support element 22' and upper coil form part 31 by welding the inner end of the spring to tab 233 and by welding the outer end of the spring to tab 237. The front and rear springs function as return springs to normally maintain the coil assembly in a zero position and to return the coil to this position after the assembled meter is de-energized. Zero adjustment of the coil is accomplished by rotating either the front support element 21' or the rear support element 22'. Where the assembled meter has a front zero adjust knob the knob is located in the cover 2 as shown in FIG. 1. Where the zero adjust knob is at the rear of the meter the zero adjust knob is located in rear wall 181 of casing 4 as shown at FIG. 13.

I. THE COIL END TERMINALS

Figure 18:
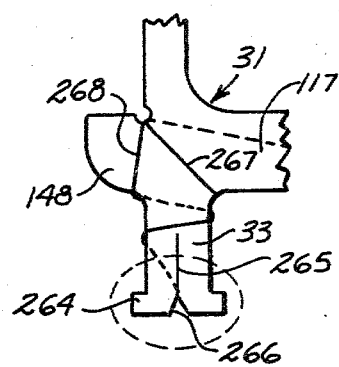
FIG. 18 is an enlarged partial view in plan of a coil terminal of the coil form part.
Figure 19:
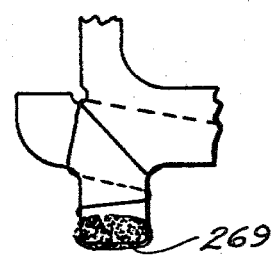
FIG. 19 is a view corresponding to FIG. 18 and showing the terminal after it is fused to connect a coil end wire to the terminal.

Another advantageous feature of the meter of this invention is the manner in which the ends of the wire of coil 18 are connected to the respective upper and lower coil form parts 31 and 32. FIG. 18 shows terminal 33 on an enlarged scale. As shown, the terminal is integral with upper coil form part 31, projects forwardly from one side of leg 117 of the coil form part, and has a slot 265 formed therein at the center of the T-shaped head 264. In addition, a V-shaped notch 266 is formed at the end of the slot 265 to facilitate guiding the wire from the coil end into the slot. The wire used to wind the coil is insulated with an insulation which deteriorates when heated, for example, a thermoplastic insulation. A first turn 267 of the wire is made across the corner of coil form part 31 and is brought under itself so a second turn 268 can be made which extends first across lug 148 whereupon the wire is then wrapped around terminal 34 and finally pulled into slot 265. Slot 265 is smaller than the diameter of the wire so the wire is temporarily mechanically held in position. No attempt is made to strip the thermoplastic insulation from the ends of the wire. Instead, terminal 34 is heated until it melts to form the ball 269 shown at FIG. 19. Such melting of the terminal 234 causes the insulation on the wire to deteriorate with the result that a good electrical and strong mechanical connection is obtained without stripping the wire by the mere expedient of melting the terminal. The terminal 34 of lower coil form part 32 is formed in the same manner.

J. ASSEMBLY

First the manner of assembly of the meter will be summarized and then the assembly steps will be described in greater detail. With reference to FIG. 2, assembly proceeds in the following manner. First, lower yoke element 11 is seated in the base. Next, coil assembly 17 is inserted in the base with the respective support elements 21 and 22 in the support structures 28 and 29 respectively of the base. Then, magnet 13 is inserted through the opening in the coil assembly to a seated position on yoke 11. Next, upper yoke element 12 is pressed downwardly into the base until it snaps into position. Then conductors 35 and 36 are pressed onto the top of the base. Then, pointer 24 is installed and the coil is statically balanced by adding the counterweight 25. Then, the front support element 21 and/or the rear support element 22 are rotated to coarsely set the zero adjustment of the pointer. Next, the flexible conductors 45 and 46 are welded between the respective support elements and conductors 35 and 36. Then, the meter movement so assembled is slipped into casing 4 by merely aligning the base with the opening and pushing the meter movement rearwardly from the position shown at FIG. 1. Scale 5 is snapped onto the back of face plate 166, zero adjust knob 7 is snapped into the opening 8 of cover 2 and cover 2 is snapped onto face plate 165. The conductors of terminal adapter 6 are connected respectively to the conductors 35 and 36 which now project through the rear of the casing and the terminal adapter is seated on the top wall of the casing and secured with the screw 9. Should rectifiers or additional resistors be required these can conveniently be located in the adapter 6. After the meter is assembled magnet 15 is magnetized in the usual manner to calibrate the meter.

With this summary in mind, a more detailed description of the assembly of the meter will now be undertaken. As previously explained with reference to FIG. 4, the central portion 91 of base 10 is flexible and by virtue of this flexibility forces exerted on the sides of the base outwardly in the direction of the arrows 260 cause the center part of the base to flex with the result that the yoke retaining legs 79 and 81 move away from the legs 80 and 82. In addition, the blocks 55 and 56 at the front of the base as well as the blocks 65 and 66 at the rear of the base are spread apart a distance somewhat greater than the outside diameter of the centering lug portions of the front and rear support elements. So spreading the base permits lower yoke element 11 to be easily inserted into the base and also permits inserting the front and rear support elements and the coil simultaneously by a simple downward movement of the assembly of FIG. 16 into the base. By virtue of the notch 106 in the lower yoke element and the arrangement of the posts 70 and 72, the yoke element can only be installed in the base with notch 106 adjacent post 72, as shown at FIG. 6.

Figure 16:
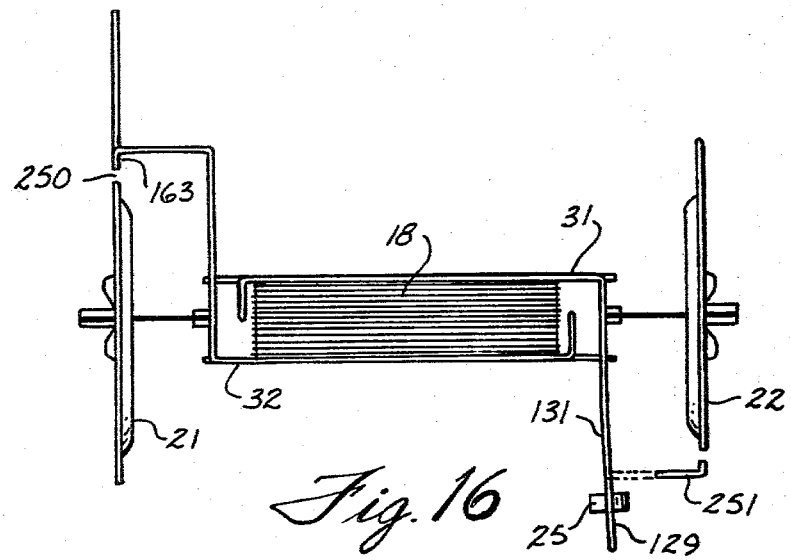
FIG. 16 is a side view in elevation of the taut band suspended coil assembly immediately before insertion into the base.

FIG. 16 shows the condition of the taut band suspension version of the coil assembly immediately before it is inserted into base 10. As shown in FIG. 16, coil 18 is in position between the respective upper and lower coil form parts 31 and 32. As will be recalled with reference to FIGS. 2 and 14, front support element 21 was initially integral with lower coil form part 32 and rear support element 22 was initially integral with upper coil part 31. To separate front support element 21 from lower coil form part 32 a short section 250 of the metal between staff support 163 and support element 21 is cut away as shown at FIG. 16. At rear support element 22 an L-shaped section 251 is cut away and the remaining horizontal portion of the legs 129 are bent downwardly to provide a straight rearwardly inclined tail 131 to receive the counter weight 25. With the assembly in the condition of FIG. 16 and with the counter weight 25 in position, this assembly is ready for insertion into base 10.

With coil assembly 17 at the stage of manufacture shown at FIG. 16, the coil assembly can be inserted in the base only with front support element 21 in front support structure 28 and rear support element 22 in rear support structure 29. If the coil assembly is turned around so it faces backwards when assembly is attempted, the bottom of tail 131 of the coil assembly will strike front post 72 of the base and cannot be properly inserted. However, when the coil assembly is properly oriented with pointer receiving staff 24 at the front of the base, tail portion 131 is above recess 92 at the rear of the base and is behind rear locating post 70. Hence, when the coil assembly and support elements are simultaneously inserted in the base, tail portion 131 is located in the region of the recess and the coil assembly can be inserted with no difficulty.

Installation of magnet 13 is accomplished merely by inserting the magnet downwardly into the base to the position shown at FIG. 5 so its lower rectangular end 105 seats in slot 103' of lower yoke element 11. As previously explained, notch 107 of the magnet prevents its installation except with this notch adjacent projection 73 of locating post 72. Upper yoke element 12 can also only be installed in one position because of the steps 96 and 97 of the upper yoke element and the corresponding steps 96' and 97' of the lower yoke element. If the upper yoke element is improperly oriented it cannot be pressed downwardly into the base a sufficient distance to allow the retaining edges 84 and 86 of the yoke retaining legs 79–82 to snap into the notches 98.

Conductors 35 and 36 are then installed by pressing these conductors into position so the posts 41 and 43 extend through the respective openings 42 and 44 of the conductors to secure the conductors on the base in predetermined positions. A coarse adjustment of front and rear elements 21 and 22 is made to approximately adjust the zero position of coil assembly 17. After this coarse adjustment is made braided conductor 45 is welded between conductor 36 and front support element 21 and braided conductor 46 is welded between conductor 35 and rear support element 22. The braided conductors 45 and 46 are sufficiently flexible that the front and rear support elements can be rotated for zero adjustment of the coil after these wires are secured to the respective support elements. Hence, either a front or a rear zero adjust arrangement can be optionally provided for the meter movement. Next, pointer 24 is pushed onto shaft 23 to the position shown at FIG. 8. No cement is required because the pointer is frictionally retained on the staff by its elasticity. Next, the meter movement is statically balanced. Counterweight 25 is initially installed on tail 131 by very lightly crimping this counterweight. This permits the counterweight to be moved to a different position, if necessary, during the final static balancing of the moving coil assembly. In addition, additional smaller weights can also be added and crimped in position to obtain a perfect static balance. Such changing of the position of balance weight 25 as well as adding weights to tail 131 can be easily accomplished because of the opening 92 at the rear of the base which provides for access to the lower end of tail 131 from below the base.

The meter movement is now in condition to be inserted in casing 4. As previously explained, the free ends 37 and 39 of the respective conductors 35 and 36 are spaced apart the same distance as the openings 195 and 196 in the rear wall 181 of casing 4. Hence, as shown in FIG. 1, to mount the meter movement in the casing it is merely necessary to align ribs 93 and 94 at the top of the base with the tracks 193 and 194 in the casing and then slide the meter movement rearwardly until fingers 192 of the casing snap into the notches 197 on the front flange of the base whereupon the meter movement is secured to the casing. Then, cover 2 is snapped onto face plate 166 and scale 5 is snapped into the recess 168 in the rear of the face plate. The scale can readily be removed and replaced since it is exposed outside the casing. The scale 5 is accurately located relative to the meter movement by the locating pins 170 at the rear of face plate 166. If desired, scale 5 can be located on the front of face plate 166 and is accurately located relative to the meter movement by the pins 176 which project from the front of the face plate. Where the terminal adapter assembly 6 is used this terminal adapter is installed next and the meter is then calibrated by magnetizing magnet 13.

The panel mounting nut 185 is supplied with the meter and in addition, several additional scale plates 5 can also be supplied to permit the user of the meter to simply adapt the meter for various purposes.

It is to be appreciated that the assembled meter can be provided with either the front zero adjust knob shown at FIG. 1 or the rear zero adjust knob shown at FIG. 13, or to make the meter even more versatile, a zero adjust knob 7 can be provided at both the front and the back of the assembled meter. This permits any desired subsequent mounting of the meter and hence, increases the versatility of the meter.

A distinct advantage of the meter construction of this invention is the same meter movement 3 can be used for meters of various sizes with no significant additional expense. The only changes required to provide any one of several different size meters are a pointer 24 of the required length for the size of the meter, and a proper counterweight to balance the meter movement. Then, it is merely necessary to select a case, scale, and cover of the appropriate size for the pointer used. It is contemplated that for example, finished meters of a size from 3 inches to 8 inches in increments of 1 inch can be provided without the necessity for any additional manufacturing steps.

The assembly described has been for the taut band version of the meter. With regard to the pivot bearing version of the meter, the assembly steps are substantially the same. With reference to FIG. 17, there is shown the coil assembly for the pivot bearing version of the meter immediately prior to insertion into the base. As shown, a short section 255 has been clipped away from between staff support 163 and front support element 21'. In addition, a short L-shaped section 256 at the rear of the assembly has been clipped away and tail 131 has been provided so it extends downwardly and is slightly inclined rearwardly. Counterweight 25 is also installed. In addition, the front and rear spiral return springs 244 and 245 have been secured between the coil assembly and the respective front support element 21' and rear support element 22'.

The manner of assembly for the pivot bearing version is essentially the same as for the taut band version in that the base is spread apart slightly, lower yoke element 11 is inserted, the assembly shown at FIG. 17 is then inserted downwardly into the base 10 so the centering lugs of the respective front and rear elements are within the arcuate surface openings of the front and rear support structures of the base and the base is then released so it closes by its own resiliency to accurately center the support elements in the front and rear structures.

An additional step required for assembly of the pivot bearing meter is the installation of the pivot screws 239 and 240. During the installation of the screws the coil assembly is held along the desired axis of rotation and the screws are tightened until the pointed tips of the screws seat in the conical depressions in the respective bearings 230 and 231. The remaining assembly steps including the installation of the magnet, the upper yoke element, and the conductors is precisely the same as previously described for the taut band version of the meter.

While several preferred embodiments of the meter of this invention have been shown and described in detail it is to be understood that numerous changes can be made in the constructions and techniques described herein without departing from the spirit and scope of this invention as defined herein and in the appended claims.

I claim:

1. As an intermediate assembly product in the manufacture of an instrument of the type having a movable element, mounted for pivotal movement and a zero adjust arrangement for setting the movable element to a zero rotational position, a movable element assembly comprising, a movable element, a zero adjust element adjacent one end of the movable element, and severable bridge means integrally connecting said movable element and zero adjust element, said zero adjust element comprising an element of the zero adjust arrangement whereby, said zero adjust element is originally fixed to said movable element and can be separated from the movable element by severing said bridge means, and means connected between the zero adjust element and said movable element for changing the rotational position of the coil in response to movement of the zero adjust element.

2. A product according to claim 1 wherein said movable element assembly is a coil assembly comprising a frame, and a coil mounted on and fixed to said frame.

3. A product according to claim 2 wherein said zero adjust element includes integral gear teeth.

4. A product according to claim 1 wherein a second zero adjust element is integral with said movable element assembly at the opposite end of the assembly from said first mentioned zero adjust element.

5. A product according to claim 1 wherein said means connected between the zero adjust element and the movable element comprises, a taut band secured between said movable element and said zero adjust element.

6. A product according to claim 1 wherein said movable element comprises a frame including first and second frame parts; and means connecting said frame parts together in electrically insulated relation with respect to each other.

7. A product according to claim 6 wherein said means connecting said coil parts together comprises a coil carried by said frame parts.

8. As an intermediate assembly product in the manufacture of an instrument of the moving coil type, a coil assembly comprising, a frame, a coil mounted on said frame and fixed to the frame, first and second coil support elements at opposite ends of said frame, severable bridge means integrally connecting said frame and said first and second support elements, and means extending between said support elements and said frame for mounting said frame and coil for pivotal movement, whereby, a movable coil is formed by severing said bridge means between said first and second support elements.

9. A product according to claim 8 wherein said frame comprises, a first electrically conductive frame portion having said first support element integral therewith, a second electrically conductive frame portion having said second support element integral therewith, said first and second frame portions being connected together in insulated relation to each other; and said means for mounting said frame and coil for pivotal movement comprises electrically conductive taut band support means extending between said first support element and one end of said frame and between said second support element and the other end of said frame; said coil having its ends connected respectively to said first and second frame portions; whereby, severing said bridge elements provides a first electrically conductive path to one end of said coil from said first support element to said first frame portion via one taut band, and a second path to the other end of said coil from said second support element to said second frame portion via the second taut band.

10. A product according to claim 8 wherein said first and second frame portions are secured to said coil.

11. A product according to claim 8 wherein at least one of said support elements has integral gear teeth thereon to provide for adjusting the zero position of said coil.

12. A product according to claim 8 wherein said frame is generally rectangular and has flange portions extending beside said coil; and generally rectangular damping ring means are secured to said flange means of said frame.

13. A product according to claim 8 wherein said product further includes staff means adjacent one end of said frame and integral therewith for mounting a pointer on said frame; and counterbalance weight mounting means on said frame adjacent the other end of said frame and integral therewith for receiving a counterweight to balance said moving coil.

* * * * *

UNITED STATES PATENT AND TRADEMARK OFFICE
CERTIFICATE OF CORRECTION

PATENT NO. : 4,238,731

DATED : December 9, 1980

INVENTOR(S) : David B. Pearson

It is certified that error appears in the above-identified patent and that said Letters Patent are hereby corrected as shown below:

Column 2, line 8, "previous. meters." should read -- previous meters.--.

Column 5, line 63, delete "from" in the last instance.

Column 6, line 57, delete the comma after "whereby".

Column 8, line 31, "mveter" should read -- meter --.

Column 12, line 67, "construction" should read -- constructing --.

Column 13, line 35, "32" should read -- 31 --.

Column 14, line 12, "31" should read -- 32 --.

Column 14, line 22, "117" should read -- 117' --.

Column 17, line 29, "a" should read -- as --.

Column 21, line 34, "231" should read -- 230 --.

Column 21, line 37, "230" should read -- 231 --.

Column 21, line 53, "234" should read -- 230 --.

Column 22, line 23, "34" should read -- 33 --.

Column 22, line 28, "34" should read -- 33 --.

Column 22, line 30, "234" should read -- 33 --.

UNITED STATES PATENT AND TRADEMARK OFFICE
CERTIFICATE OF CORRECTION

PATENT NO. : 4,238,731
DATED : December 9, 1980
INVENTOR(S) : David B. Pearson

It is certified that error appears in the above-identified patent and that said Letters Patent are hereby corrected as shown below:

Claim 10, column 26, line 67, "8" should read -- 9 --.

In the Drawing Figures:

Fig. 14, "116'" on damping ring 144 should be -- 161' --.

Signed and Sealed this

Nineteenth Day of October 1982

[SEAL]

Attest:

GERALD J. MOSSINGHOFF

*Attesting Officer*     *Commissioner of Patents and Trademarks*